United States Patent
Suzuki

(10) Patent No.: US 9,603,268 B2
(45) Date of Patent: Mar. 21, 2017

(54) GAS BARRIER FILM, METHOD OF PRODUCING A GAS BARRIER FILM, AND ELECTRONIC DEVICE

(75) Inventor: Issei Suzuki, Fuchu (JP)

(73) Assignee: KONICA MINOLTA, INC., Tokyo (JP)

( * ) Notice: Subject to any disclaimer, the term of this patent is extended or adjusted under 35 U.S.C. 154(b) by 192 days.

(21) Appl. No.: 13/988,295

(22) PCT Filed: Nov. 18, 2011

(86) PCT No.: PCT/JP2011/076663
§ 371 (c)(1),
(2), (4) Date: May 17, 2013

(87) PCT Pub. No.: WO2012/067230
PCT Pub. Date: May 24, 2012

(65) Prior Publication Data
US 2013/0252002 A1    Sep. 26, 2013

(30) Foreign Application Priority Data
Nov. 19, 2010  (JP) .................................. 2010-258630

(51) Int. Cl.
*H05K 5/02* (2006.01)
*H01L 21/02* (2006.01)
(Continued)

(52) U.S. Cl.
CPC .............. *H05K 5/0213* (2013.01); *C08J 7/04* (2013.01); *C08J 7/123* (2013.01);
(Continued)

(58) Field of Classification Search
CPC ............ H05K 5/0213; H01L 21/02225; H01L 21/02274; H01L 21/02263;
(Continued)

(56) References Cited

U.S. PATENT DOCUMENTS

| | | |
|---|---|---|
| 2009/0072230 A1 | 3/2009 | Ito et al. |
| 2009/0110896 A1 | 4/2009 | Kuramachi et al. |
| 2011/0177342 A1 | 7/2011 | Itoh et al. |

FOREIGN PATENT DOCUMENTS

| | | |
|---|---|---|
| JP | 08-281861 A | 10/1996 |
| JP | 2003118030 A | 4/2003 |

(Continued)

OTHER PUBLICATIONS

Rosink et al., "34.1 Ultra-Thin Encapsulation for Large-Area OLED displays", SID Symposium Digest of Technical Papers vol. 36, Issue 1, pp. 1272-1275, May 2005.*

(Continued)

*Primary Examiner* — Jonathan Langman
(74) *Attorney, Agent, or Firm* — Holtz, Holtz & Volek PC

(57) ABSTRACT

Provided is a gas barrier film including a base, a first barrier layer containing silicon which is formed on at least one surface of the base, and a second barrier layer containing silicon oxynitride which is formed on the first barrier layer. The water vapor transmission rate (g/m²/day) at 40° C. and 90% RH in a structure in which the first barrier layer is formed on the base is $R_1$ and the water vapor transmission rate (g/m²/day) at 40° C. and 90% RH in a structure in which the first barrier layer and the second barrier layer are laminated on the base is $R_2$, and the ratio of the water vapor transmission rate $R_1$ to the water vapor transmission rate $R_2$ ($R_1/R_2$) is 80 or more and 5000 or less. Hereby, excellent barrier performance can be exhibited under a high-temperature and high-humidity environment.

12 Claims, 2 Drawing Sheets

(51) Int. Cl.
*H05B 33/04* (2006.01)
*C08J 7/04* (2006.01)
*C08J 7/12* (2006.01)
*C23C 14/06* (2006.01)
*H01L 51/52* (2006.01)

(52) U.S. Cl.
CPC ...... *C23C 14/0652* (2013.01); *C23C 14/0676* (2013.01); *H01L 21/02107* (2013.01); *H01L 21/02225* (2013.01); *H01L 21/02263* (2013.01); *H01L 21/02274* (2013.01); *H05B 33/04* (2013.01); *H01L 51/5253* (2013.01)

(58) Field of Classification Search
CPC .......... H01L 21/02107; H01L 51/5253; H05B 33/04; C08J 7/04; C08J 7/123; C23C 14/0652; C23C 14/0676
See application file for complete search history.

(56) References Cited

FOREIGN PATENT DOCUMENTS

| | | |
|---|---|---|
| JP | 2007-062305 A | 3/2007 |
| JP | 2007237702 A | 9/2007 |
| JP | 2007277631 A | 10/2007 |
| JP | 2009-038019 A | 2/2009 |
| JP | 2009-090634 A | 4/2009 |
| JP | 2009-241483 A | 10/2009 |
| JP | 2009-255040 A | 11/2009 |
| KR | 1020000043921 A | 7/2000 |
| WO | 2010/004932 A1 | 1/2010 |

OTHER PUBLICATIONS

Machine English Translation of FujiFilm Corp (JP2007-237702) obtained from the JPO website on Mar. 30, 2015.*

Chen et al., "High-Performance Transparent Barrier Films of SiOx/SiNx Stacks on Flexible Polymer Substrates", Journal of The Electrochemical Society, vol. 153, No. 10, 2006, F244-F248.*

Extended European Search Report (EESR) dated Mar. 27, 2014 issued in counterpart European Application No. 11841355.8.

Korean Office Action dated May 29, 2014 in counterpart Korean Application No. 10-2013-7012543.

International Preliminary Report on Patentability (IPRP) dated May 21, 2013 (and English translation thereof) issued in International Application No. PCT/JP2011/076663.

International Search Report (ISR) dated Feb. 21, 2012 issued in parent International Application No. PCT/JP2011/076663.

Japanese Office Action (and English translation thereof) dated May 26, 2015, issued in counterpart Japanese Application No. 2012-544321.

* cited by examiner

US 9,603,268 B2

GAS BARRIER FILM, METHOD OF PRODUCING A GAS BARRIER FILM, AND ELECTRONIC DEVICE

CROSS-REFERENCE TO RELATED APPLICATIONS

This is based upon and claims the benefit of priority from prior Japanese Patent Application No. 2010-258630, filed Nov. 19, 2010, the entire contents of which are incorporated herein by reference.

TECHNICAL FIELD

The present invention relates to a gas barrier film, a method of producing the gas barrier film and an electronic device using the gas barrier film, and more particularly to a gas barrier film that is used in packages principally of electronic devices, solar cells, display materials such as a plastic substrate for an organic EL element and liquid crystal, a method of producing the gas barrier film, and an electronic device using the gas barrier film.

BACKGROUND ART

Gas barrier films on which a thin film of a metal oxide such as aluminum oxide, magnesium oxide or silicon oxide is formed on a surface of a plastic substrate or a film have been widely used in packaging applications for articles that require blockage of various kinds of gases such as water vapor and oxygen, and packaging applications for preventing degeneration of foods, industrial products, pharmaceuticals and the like. The gas barrier film is used in liquid crystal display elements, solar cells, organic electroluminescence (EL) substrates, and the like, besides the packaging applications described above.

As a method for producing such a gas barrier film, principally a method of forming a gas barrier layer by a plasma chemical vapor deposition (CVD) method (chemical gas-phase growing method, chemical evaporation method), a method of applying a coating solution having a polysilazane as a main component, followed by carrying out a surface treatment, or a method using these methods in combination is known (see, for example, Patent Literatures 1 and 2).

An invention described in Patent Literature 1 discloses that an increase of thickness and suppression of cracks for high gas barrier properties are achieved by a laminate formation method of repeating steps of forming a polysilazane film having a thickness of 250 nm by a wet method and applying thereto vacuum ultraviolet light twice or more.

An invention described in Patent Literature 2 discloses a method for enhancing barrier properties by applying and laminating polysilazane onto a gas barrier layer formed on a resin base by a vacuum plasma CVD method, and reinforcing the gas barrier layer by a heat treatment.

CITATION LIST

Patent Literature

Patent Literature 1: JP 2009-255040 A
Patent Literature 2: JP 08-281861 A

SUMMARY OF THE INVENTION

Problem to be Solved by the Invention

As to the method described in Patent Literature 1, however, there remains such a problem that the repeating of lamination of a gas barrier layer for merely obtaining higher gas barrier properties results in flexibility being not always sufficient. Further, there has been newly found such a problem that a phenomenon occurs in which a stress at the time of cutting processing causes cracks generating from a cut edge portion such that a film itself is broken and consequently, an effective area as a product is decreased due to cracking from a cut surface, leading to deterioration of productivity.

A water vapor transmission rate of the gas barrier film produced by the method described in Patent Literature 2 was $1 \times 10^{-2}$ g/m$^2$-day as the sample described in Example; however, the property is insufficient as a gas barrier layer for organic photoelectric conversion elements and the like. Also there is a disadvantage that resin bases which can be used for organic conversion elements (electronic devices) and the like are limited to resin bases having excellent heat resistance because it takes as much time as an hour at 1.60° C. for the heat treatment of polysilazane.

The present invention has been made in view of the above-mentioned problem, and an object of the invention is to provide a gas barrier film which can exhibit excellent gas barrier performance under a high-temperature and high-humidity environment, a method of producing thereof, and an electronic device using the gas barrier film.

Means to Solve the Problem

The above object is achieved by the following constitutions.

1. A gas barrier film including: a base (substrate); a first barrier layer containing silicon, which is formed on at least one surface of the base; and a second barrier layer containing silicon oxynitride, which is formed on the first barrier layer, wherein the water vapor transmission rate (g/m$^2$/day) at 40° C. and 90% RH in a structure in which the first barrier layer is formed on the base is $R_1$; and the water vapor transmission rate (g/m$^2$/day) at 40° C. and 90% RH in a structure in which the first barrier layer and second barrier layer are laminated on the base is $R_2$, the ratio of the water vapor transmission rate $R_1$ to the water vapor transmission rate $R_2$ ($R_1/R_2$) is 80 or more and 5000 or less.

2, A method for producing a gas barrier film in which a base (substrate); a first barrier layer containing silicon, which is formed on at least one surface of the base by a plasma chemical vapor deposition method using at least an inorganic silicon compound as a raw material; and a second barrier layer containing silicon oxynitride, which is formed on the first barrier layer by applying an inorganic compound-containing liquid, and then subjected to a modification treatment, are laminated in this order, wherein the water vapor transmission rate (g/m$^2$/day) at 40° C. and 90% RH in a structure in which the first barrier layer is formed on the base is $R_1$; and the water vapor transmission rate (g/m$^2$/day) at 40° C. and 90% RH in a structure in which the first barrier layer and second barrier layer are laminated on the base is $R_2$, the ratio of the water vapor transmission rate $R_1$ to the water vapor transmission rate $R_2$ ($R_1/R_2$) is 80 or more and 5000 or less.

3. An electronic device using the gas barrier film according to a first aspect of the invention.

Advantageous Effects of the Invention

According to the invention, there can be provided a gas barrier film which can exhibit excellent gas barrier performance under a high-temperature and high-humidity envi-

DESCRIPTION OF EMBODIMENTS

Figure 1:
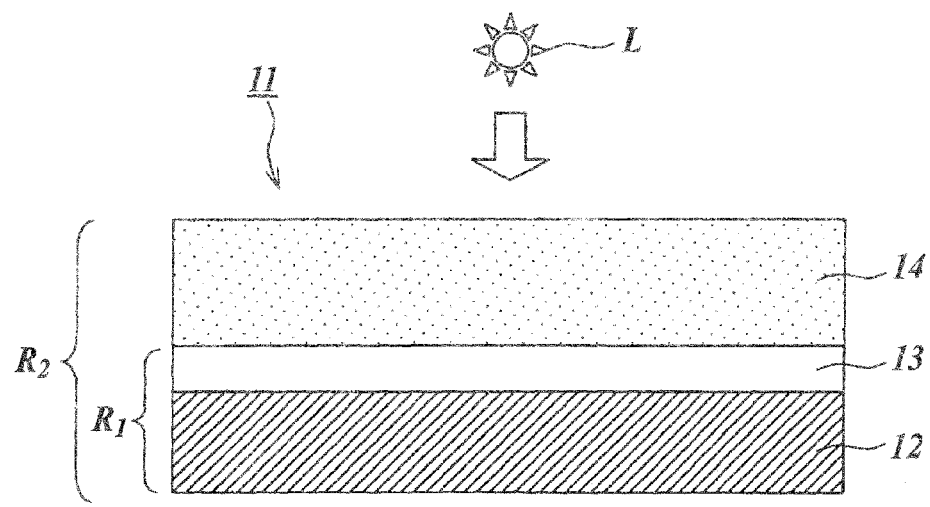
FIG. 1 is a schematic sectional view showing one example of the layer structure of a gas barrier film according to an embodiment of the invention.

Embodiments for carrying out the invention will be described in detail below.

The present inventors have conducted diligent studies in view of the above-mentioned problem, and resultantly found as the invention that a gas barrier film, which can exhibit excellent barrier performance under a high-temperature and a high-humidity environment, can be achieved by a gas barrier film including a base; a first barrier layer containing at least silicon, which is laminated on at least one surface of the base; and a second barrier layer containing silicon oxynitride, which is laminated on the first barrier layer. The water vapor transmission rate (g/m$^2$/day) at 40° C. and 90% RH of a structure in which the first barrier layer is formed on the base is $R_1$; and the water vapor transmission rate (g/m$^2$/day) at 40° C. and 90% RH of a structure in which the first barrier layer and second barrier layer are laminated on the base is $R_2$, the ratio of the water vapor transmission rate $R_1$ to the water vapor transmission rate $R_2$ ($R_1/R_2$) is 80 or more and 5000 or less.

Technical ideas according to an embodiment of the invention will be described below. A barrier film having a laminated structure, in which a silicon oxide layer formed by a plasma chemical vapor deposition and a silicon oxide layer formed by applying a liquid containing a polysilazane and heating are laminated, has been known from JP 7-93595 A, for example. Such attempts have been made to improve barrier performance by complementing the performance of a silicon oxide layer formed by a plasma chemical vapor deposition method and the performance of a silicon oxide layer formed by a coating method each other. It has been found that concerning barrier performance of such a barrier film, barrier performance that is unsatisfactory but is acceptable to a certain extent is exhibited in evaluation under high-humidity conditions in an environment at 40° C. and 90% RH, or the like, but under a high-temperature and high-humidity environment such as at 60° C. and 90% RH, a stress generated due to film fluctuation cannot be sufficiently relaxed, and therefore the water vapor transmission rate is deteriorated to the extent that practical use is impossible, leading to a problem in durability when the film is used in an electronic device substrate.

Thus, diligent studies have been conducted for solving the above-mentioned problem, and resultantly it has been found that by setting a ratio of the water vapor transmission rate of a lower layer composed of a silicon-containing layer having a stress relaxation function and the water vapor transmission rate of a laminated film with a barrier layer formed by applying a liquid containing an inorganic compound onto the silicon-containing layer and then modifying the layer into silicon oxynitride such that the ratio falls within a specified range, a barrier film which is free from deterioration of the water vapor transmission rate even under a high-temperature and high-humidity environment and is excellent for use as a substrate of an electronic device is obtained.

The capability also relates to the film density of a layer laminated, and it is considered that when the lower layer be hard and too dense, a stress cannot be sufficiently relaxed, and therefore high-temperature and high-humidity durability is deteriorated, and when, conversely a gap in film quality between upper and lower layers be too large, high-temperature and high-humidity durability is similarly deteriorated due to stress generated between layers. Specifically, the film density of the lower layer (silicon-containing layer) is preferably in a range of 2.15 to 2.4 g/cm$^3$, and the film density of the upper layer (silicon oxynitride) is preferably in a range of 1.8 to 2.1 g/cm$^3$.

The conventional technique also has such a problem that since a silicon oxide of the lower layer is deposited using an organic silicon compound for a plasma CVD raw material, carbon easily remains in the film and in-film defects are generated, and the effect of improving barrier performance is small when a barrier layer is formed on the upper layer by coating. In an embodiment according to the invention, a silicon compound having reduced defects is formed preferably by using a silicon compound as a raw material, so that the effect of improving barrier performance by the coated barrier layer is high.

Further, an embodiment according to the invention has such a feature that the effect of improving barrier performance by complementing of barrier performance is further enhanced preferably by forming both upper and lower layers with silicon oxynitride.

In a preferred embodiment according to the invention, a silicon layer is formed as a first barrier layer on a base using a plasma chemical vapor deposition method with an inorganic silicon compound as a raw material and the first barrier layer is preferably a silicon nitride (SiN) film, a silicon oxynitride (SiON) film or a silicon oxide (SiO$_2$) film formed using, as a raw material, monosilane (SiH$_4$) as an inorganic silicon compound and at least one gas selected from ammonia gas, hydrogen gas, nitrogen gas and nitrogen oxide gas. The water vapor transmission rate $R_1$ is, specifically, preferably in a range of 1.0 (g/m$^2$/day)≥$R_1$≥1.0×10$^{-3}$ (g/m$^2$/day). The structure in which the first barrier layer is formed on the base as described above is a soft layer having a relatively high water vapor transmission rate and a relatively low density and is thus poor in terms of barrier properties, but has an advanced stress relaxation layer and exhibits effects of improving adhesion between the base and a second barrier layer and relaxing stresses of expansion and contraction, pressing forces and so on to which the second barrier layer is subjected.

Next, a layer containing silicon oxynitride, which is formed by applying an inorganic compound-containing liquid, and then subjected to a modification treatment, is laminated as the second barrier layer on the first barrier layer formed using a plasma chemical vapor deposition, so that a gas barrier film may be prepared. The second barrier layer is formed of silicon oxynitride (SiON) and the water vapor transmission rate $R_2$ of the structure which includes the second barrier layer is, specifically, preferably in a range of 1.0×10$^{-3}$ (g/m$^2$/day)>$R_2$≥1.0×10$^{-5}$ (g/m$^2$/day). The layer is hard and has extremely high gas barrier properties and a relatively high density, and thus poor in terms of a stress relaxation capability but exhibits excellent gas barrier properties.

In an embodiment according to the invention, the ratio of the water vapor transmission rate $R_1$ to the water vapor transmission rate $R_2$ ($R_1/R_2$) is 80 or more and 5000 or less. That is, the water vapor transmission rate $R_2$ of the structure including the second barrier layer formed on the first barrier layer is reduced to 1/80 to 1/5000 with respect to the water vapor transmission rate $R_1$ of the structure including only the first barrier layer provided on the base.

In a structure with $R_1/R_2$ being less than 80, the water vapor transmission rate $R_1$ of the first barrier layer tends to relatively approximate the water vapor transmission rate $R_2$ of the second barrier layer, i.e. an upper layer, and therefore a dense and hard layer is formed, so that the stress relaxation capability may be degraded and durability at a high temperature and high humidity may be deteriorated. On the other hand, in a structure with $R_1/R_2$ being more than 5000, there is a significantly large difference in film properties between the first barrier layer and the second barrier layer, so that durability at a high temperature and high humidity may be similarly deteriorated.

By effectively laminating two barrier layers having different film properties in this way, adhesion between layers was improved and particularly gas barrier properties under a high-temperature and high-humidity environment could be dramatically improved.

It is necessary to adjust the water vapor permeabilities $R_3$ and $R_2$, respectively, so as to ensure that the ratio of the water vapor transmission rate $R_1$ to the water vapor transmission rate $R_2$ ($R_1/R_7$) becomes 80 or more and 5000 or less. The water vapor transmission rate $R_1$ can be made to fall within a predetermined range by appropriately adjusting formation conditions when the first barrier layer is formed. Examples of the specific method include a method to control the power supply to a plasma CVD apparatus during the film formation, for which the power is preferably adjusted within a range of 300 V to 1000 V so that the base may not be thermally damaged. As to a method which the gas pressure during film formation is adjusted, it is preferable to adjust the gas pressure within a range of 0.1 Pa to 1.0 Pa. The water vapor transmission rate $R_2$ can be made to fall within a predetermined range by appropriately adjusting formation conditions when the first barrier layer and the second barrier layer are formed. While specific methods for the first barrier layer formation are described above, examples of the specific method for the second barrier layer include a method to adjust the formation thickness of the second barrier layer and the thickness is preferably 100 nm to 1 µm. Another method is to adjust the excimer light intensity and the intensity of the excimer light is preferably in a range of 100 mW/cm² to 200 mW/cm².

Further, where the water vapor transmission rate (g/m²/day) at 60° C. and 90% RH or more in a structure in which the first barrier layer and the second barrier layer are laminated is designated as $R_3$, $R_3$ is preferably in a range of $1.0 \times 10^{-4}$ (g/m²/day)$> R_3 \% \geq 7.0 \times 10$ (g/m²/day), and particularly preferably in a range of $1.0 \times 10^{-5}$ (g/m²/day)$> R_3 \geq 6.0 \times 10^{-5}$ (g/m²/day). As long as $R_3$ is in the range described above, the barrier film can be favorably applied to electronic devices as well.

The gas barrier film of an embodiment according to the invention will be described in detail below.

First, the layer structure of the gas barrier film of the embodiment according to the invention will be described with reference to the drawings.

FIG. 1 is a schematic sectional view showing one example of the layer structure of the gas barrier film of the embodiment according to the invention.

In FIG. 1, a gas barrier film 11 of the embodiment according to the invention has a structure in which a first barrier layer 13 containing silicon is laminated on a base (substrate) 12 and a second barrier layer 14 containing silicon oxynitride is laminated on the first barrier layer 13.

When the second barrier layer 14 is formed by a wet coating method, an inorganic compound-containing liquid is applied onto the first barrier layer 13 to form a coated film, which is then subjected to a modification treatment using, from the upper part, a modification treatment means L such as an irradiation of vacuum ultraviolet light having a wavelength component of 180 nm or less, for example.

When the first barrier layer 13 of the embodiment according to the invention is formed by a plasma chemical vapor deposition (CVD) method, an atmospheric pressure CVD method or a vacuum plasma CVD method can be appropriately selected as the plasma chemical vapor deposition method.

The water vapor transmission rate $R_1$ defined in the embodiment according to the invention is a water vapor transmission rate $R_1$ in a unit of the base 12 and the first barrier layer 13 as shown in FIG. 1, and the water vapor transmission rate $R_2$ is a water vapor transmission rate $R_2$ in a unit composed of the base 12, the first barrier layer 13 and the second barrier layer 14.

The first barrier layer 13 formed by a plasma chemical vapor deposition method in the embodiment according to the invention is preferably a silicon nitride film, a silicon oxynitride film or a silicon oxide film formed using monosilane ($SiH_4$) as an inorganic silicon compound and at least one gas selected from ammonia gas, hydrogen gas, nitrogen gas and nitrogen oxide gas as a raw material. Further, both the first barrier layer 13 and the second barrier layer 14 are preferably formed of a silicon oxynitride (SiON) film.

In the gas barrier film 11 of the embodiment according to the invention, various kinds of functional layer(s) may be provided as necessary in addition to the first barrier layer 13 and the second barrier layer 14.

Figure 2:
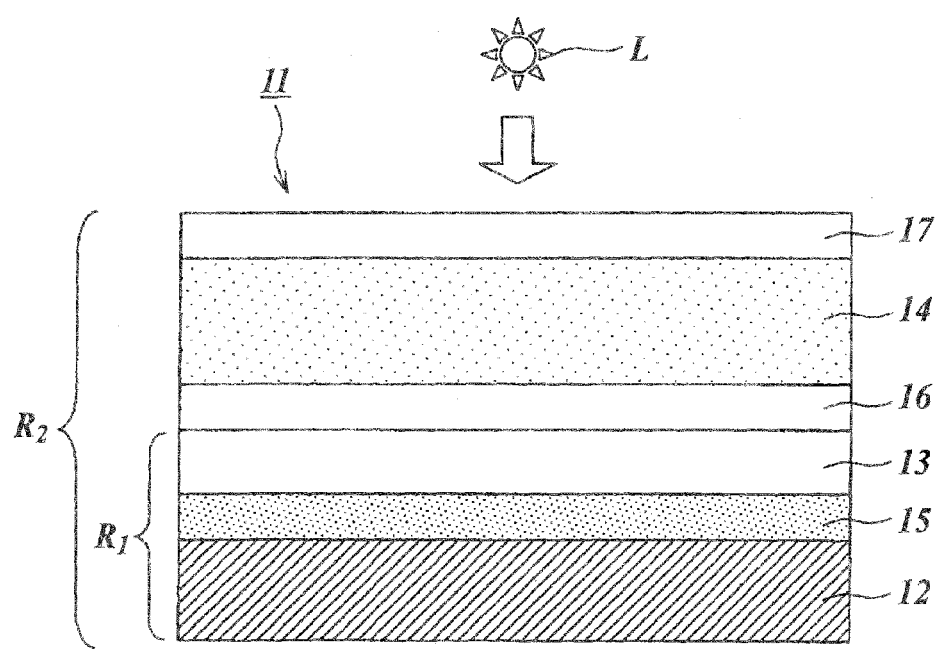
FIG. 2 is a schematic sectional view showing another example of the layer structure of a gas barrier film according to an embodiment of the invention.

FIG. 2 is a schematic sectional view showing one example of a structure in which various kinds of functional layers are provided in addition to the first barrier layer 13 and the second barrier layer 14 as a layer structure of the gas barrier film of an embodiment according to the invention.

In FIG. 2, a smooth layer (clear hard coat layer) or a bleed-out preventing layer may be provided as a primary layer 15 between the base 12 and the first barrier layer 13. An intermediate layer 16 may be provided between the first barrier layer 13 and the second barrier layer 14, or a protective layer 17 may be provided as an outermost layer on the second barrier layer 14. In the layer structure as described above, the water vapor transmission rate $R_1$ defined in the invention is a water vapor transmission rate after layers up to and including the first barrier layer 13 are formed, and the water vapor transmission rate $R_2$ is a water vapor transmission rate after layers up to and including the protective layer 17 are formed.

The water vapor transmission rate $R_1$ and the water vapor transmission rate $R_2$ are defined including various kinds of functional layers in this way.

Components of the gas barrier film of the embodiment according to the invention will be described in detail below.

<Gas Barrier Film>

The gas barrier film of the embodiment according to the invention has the first barrier layer 13 and the second barrier layer 14 on at least one surface side of the base 12 as shown in FIG. 1.

[First Barrier Layer]

In the embodiment according to the invention, the first barrier layer is preferably a layer containing silicon, which is formed by a plasma chemical vapor deposition method using an inorganic silicon compound as a raw material.

Generally, methods of forming a functional layer on a base are classified broadly into a physical gas-phase growing method and a chemical gas-phase growing method. The physical gas-phase growing method is a method of depositing a thin film of a desired substance (e.g. carbon film and the like.) on the surface of a substance in a gas phase by a physical method and examples of the physical method include vapor deposition (conduction resistance heating, electron beam deposition and molecular-beam epitaxy) methods, an ion plating method and a sputtering method. On the other hand, the chemical gas-phase growing method (chemical vapor deposition method) is a method of supplying onto a base a source gas containing a component of a desired thin film and depositing a film by a chemical reaction at the base surface or in a gas phase, and there is also a method of producing a plasma or the like for activating the chemical reaction. The method is not particularly limited and examples thereof include known CVD methods such as a thermal CVD method, a catalytic chemical gas-phase growing method, a photo-CVD method, a plasma CVD method and an atmospheric plasma CVD method but in the invention, a plasma chemical vapor deposition method (hereinafter, abbreviated as a plasma CVD method) is used from the viewpoint of a film formation speed and a treatment area.

Figure 3:
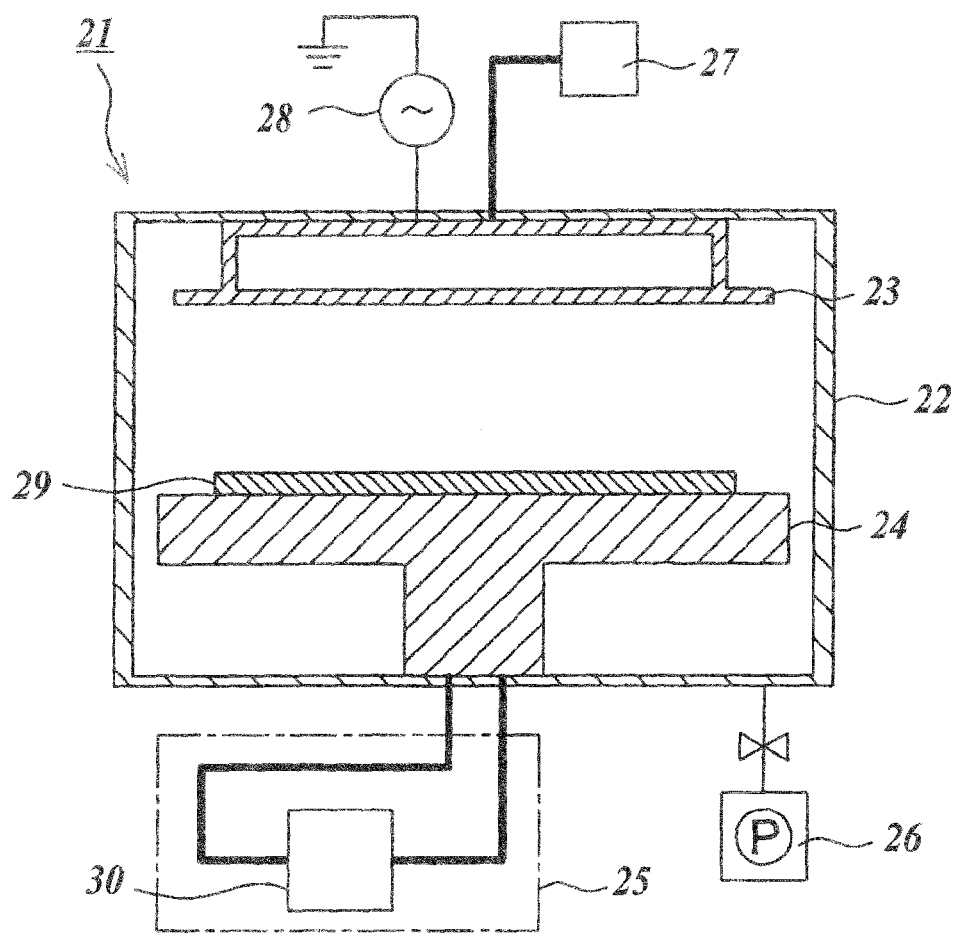
FIG. 3 is a schematic sectional view showing one example of a plasma chemical vapor deposition apparatus used for formation of a first barrier layer according to an embodiment of the invention.

FIG. 3 shows one example of a plasma chemical vapor deposition apparatus (hereinafter, abbreviated as a plasma CVD apparatus) that is applied for formation of a first barrier layer according to the invention.

Numeral 21 in FIG. 3 denotes plasma CVD apparatus applicable to the invention.

The plasma CVD apparatus 21 has a vacuum chamber 22, and a susceptor 24 is provided on the bottom surface side in the vacuum chamber 22.

On the ceiling side in the vacuum chamber 22, a cathode electrode 23 is provided at a position opposite to the susceptor 24.

A heat medium circulation system 25, a vacuum evacuation system 26, a gas introduction system 27 and a high-frequency power source 28 are provided at the outside of the vacuum chamber 22. A heat medium is received within the heat medium circulation system 25.

The heat medium circulation system 25 is provided with a heating-cooling unit 30 having a pump for transferring a heat medium, a heating unit for heating the heat medium, a cooling unit for cooling the heat medium, a temperature sensor for measuring the temperature of the heat medium, and a storage unit for storing the set temperature of the heat medium.

The heating-cooling unit 30 is configured so that the temperature of the heat medium may be measured, and the heat medium may be heated or cooled to a stored set temperature and supplied to the susceptor 24. The supplied heat medium passes through the interior of the susceptor 24 to heat or cool the susceptor 24, and returns to the heating-cooling unit 30. At this time, the temperature of the heat medium is higher or lower than the set temperature and the heating-cooling unit 30 heats or cools the heat medium to the set temperature and supplies the heat medium to the susceptor 24. The cooling medium is thus circulated between the susceptor and the heating-cooling unit 30 and the susceptor 24 is heated or cooled by the supplied heat medium at the set temperature.

The vacuum chamber 22 is connected to the vacuum evacuation system 26, the interior of the vacuum chamber 22 is evacuated under vacuum, the heat medium is heated from room temperature to the set temperature and the heat medium at the set temperature is supplied to the susceptor 24 in advance before a film formation treatment is started by the plasma. CVD apparatus 21. The susceptor 24 is at room temperature at the beginning of use, and the temperature of the susceptor 24 is elevated when the heat medium at the set temperature is supplied.

The heat medium at the set temperature is circulated for a predetermined period of time and thereafter a base (substrate) 29 as a film formation object is delivered into the vacuum chamber 22 and placed on the susceptor 24 while the vacuum atmosphere within the vacuum chamber 22 is maintained.

A large number of nozzles (holes) are formed on a side facing the susceptor 24 of the cathode electrode 23. The cathode electrode 23 is connected to the gas introduction system 27 and when a CVD gas is introduced from the gas introduction system 27 to the cathode electrode 23, the CVD gas is ejected from the nozzles of the cathode electrode 23 into the vacuum chamber 22 in a vacuum atmosphere.

The cathode electrode 23 is connected to the high-frequency power source 28 and the susceptor 24 and the vacuum chamber 22 are connected at a ground electric potential.

A CVD gas is supplied from the gas introduction system 27 into the vacuum chamber 22, the high-frequency power source 28 is started while a heat medium at a predetermined temperature is supplied from the heating-cooling unit 30 to the susceptor 24 and a high-frequency voltage is applied to the cathode electrode 23 so as to form a plasma of the introduced CVD gas.

When the CVD gas activated in the plasma arrives at the surface of the base 29 on the susceptor 24, a thin film of a first barrier layer grows on the surface of the base 29.

During growth of the thin film, the heat medium at a predetermined temperature is supplied from the heating-cooling unit 30 to the susceptor 24, and the first barrier layer is formed while the susceptor 24 is kept at the predetermined temperature by being heated or cooled by the heat medium.

Generally, the lower limit of the growth temperature, at which the first barrier is formed, is determined from the film quality of the first barrier layer, and the upper limit temperature is determined by the acceptable range from the viewpoint of damage of the base 29 itself and thin films that have been formed on the base 29 (clear hard coat layer, bleed-out preventing layer, and the like).

The lower limit temperature and the upper limit temperature vary depending on the material of the first barrier layer that is formed, the material of thin films that have been formed, and so on, but when a SiN film, a SiON film and a $SiO_2$ film according to the invention are formed, the lower limit temperature is 50° C., and the upper limit temperature is equal to or lower than the heat-resistant temperature of the base.

In the invention, the correlation between the film quality of the first gas barrier layer formed by the plasma CVD method and the film formation temperature and the correlation between damage received by a film formation object (base 29) and the film formation temperature are determined beforehand and the lower limit temperature and the upper limit temperature of the base 29 during the plasma CVD process is preferable 50° C. and 250° C., respectively.

Further, the relationship between the temperature of the heat medium supplied to the susceptor 24 and the temperature of the base 29 when a plasma is formed by applying a high-frequency voltage of 13.56 MHz or more to the cathode electrode 23 is measured beforehand and the temperature of the heat medium supplied to the susceptor 24 so as to keep the temperature of the base 29 from the lower limit temperature or more to the upper limit temperature or less during the plasma CVD process.

The temperature is the lower limit temperature (50° C. here) and the lower limit temperature is stored so as to set such that the heat medium the temperature of which is controlled to the lower limit temperature or higher is supplied to the susceptor 24. The heat medium returned from the susceptor 24 is heated or cooled and the heat medium at a set temperature of 50° C. is supplied to the susceptor 24.

In the invention, a silicon nitride film, a silicon oxynitride film or a silicon oxide film is preferably formed using, as a raw material, monosilane ($SiH_4$) as an inorganic silicon compound and at least one gas selected from ammonia gas, hydrogen gas, nitrogen gas and nitrogen oxide gas as a CVD gas used for formation of the first barrier layer. The SiN film, SiON film or $SiO_2$ film is formed while the base 29 is kept at a temperature from the lower limit temperature or more to the upper limit temperature or less.

Just after the plasma CVD apparatus 21 is started, the susceptor 24 is at room temperature and the temperature of the heat medium returned from the susceptor 24 to the heating-cooling unit 30 is lower than the set temperature. Therefore, just after starting, the heating-cooling unit 30 heats the returned heat medium to increase its temperature to the set temperature and supplies the heat medium to the susceptor 24. In this case, the susceptor 24 and the base 29 are heated by the heat medium so that their temperature may be elevated and the temperature of the base 29 may be kept from the lower limit temperature or more to the upper limit temperature or less.

When the first barrier layer is continuously formed on a plurality of sheets of the base 29, the temperature of the susceptor 24 is elevated by heat that flows in from the plasma. In this case, since the heat medium returned from the susceptor 24 to the heating-cooling unit 30 has a temperature higher than the lower limit temperature (50° C.), the heating-cooling unit 30 cools the heat medium and supplies the heat medium at the set temperature to the susceptor 24. Consequently, a thin film can be formed while the temperature of the base 29 is kept from the lower limit temperature or more to the upper limit temperature or less.

In this way, the heating-cooling unit 30 heats the heat medium when the temperature of the returned heat medium is lower than the set temperature and cools the heat medium when the temperature of the returned heat medium is higher than the set temperature, so that, in any case, the heat medium at the set temperature is supplied to the susceptor, and as a result, the base 29 is kept at a temperature from the lower limit temperature or more to the upper limit temperature or less.

When the first barrier layer is formed in a predetermined thickness, the base 29 is delivered to outside from the vacuum chamber 22 and a base 29 having no film formed thereon is delivered into the vacuum chamber 22, where the first barrier layer is formed while the heat medium at the set temperature is supplied as described above.

As a specific adjustment method for achieving a desired water vapor transmission rate $R_1$ as the first barrier layer of the embodiment according to the invention, a method of controlling the film thickness formed as the first barrier layer, a method of controlling the supply power during film formation in the plasma CVD apparatus, a method of controlling the gas pressure during film formation, a method of controlling the feed rate of an inorganic silicon compound as a raw material during film formation or the like can be appropriately selected or combined.

The thickness of the first barrier layer is in a range of 1 nm to 10 μm, preferably 10 nm to 1 μm, further preferably 10 nm to 100 nm, and especially preferably 10 nm to 50 nm.

The first barrier layer of the embodiment according to the invention can be individually made with a different composition such as silicon oxide, a metal oxide having silicon oxide as a main component, or a mixture with a metal carbide, a metal nitride, a metal sulfide, a metal halide or the like (metal oxynitride, metal halide oxide or the like) by selecting conditions such as an organic metal compound as a raw material (also referred to as a primary material), a decomposition gas, a decomposition temperature and input power in the atmospheric pressure plasma CVD method.

For example, if a silicon compound is used as a raw material compound and oxygen is used as a decomposition gas, a silicon oxide is generated. If silazane or the like is used as a raw material compound, silicon oxynitride is generated. This is because since very active charge particles/active radicals are present in a high density in a plasma space, multi-stage chemical reactions are promoted at a very high rate in the plasma space, so that elements present in the plasma space are converted into a thermodynamically stable compound in a very short time.

The raw material for formation of such a ceramic layer may be in any of a gaseous state, a liquid state and a solid state under an ordinary temperature and normal pressure as long as it is a silicon compound. In the case of a gas, the raw material can be introduced directly into a discharge space, but in the case of a liquid or a solid, the raw material is vaporized and used by methods such as heating, bubbling, pressure reduction or ultrasonic irradiation. Also, the raw material may be diluted with a solvent, and as the solvent, an organic solvent such as methanol, ethanol or n-hexane, or a mixed solvent thereof can be used. These diluent solvents are decomposed into a molecular form or an atomic form during a plasma discharge treatment and therefore influences thereof can be almost ignored.

Examples of such a silicon compound include silane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldisiloxane, bis(dimethylamino)dimethylsilane, bis(dimethylamino) methylvinylsilane, bis(ethylamino) dimethylsilane, N,O-bis(trimethylsilyl)acetamide, bis(trimethylsilyl)carbodiimide, diethylaminotrimethylsilane, dimethylaminodimethylsilane, hexamethyldisilazane, hexamethylcyclotrisilazane, heptamethyldisilazane, nonamethyltrisilazane, octamethylcyclotetrasilazane, tetrakisdimethylaminosilane, tetraisocyanatesilane, tetramethyldisilazane, tris(dimethylamino)silane, triethoxyfluorosilane, allyldimethylilane, allyltrimethylsilane, benzyltrimethylsilane, bis(trimethylsilyl)acetylene, 1,4-bistrimethylsiyl-1,3-butadiyne, di-t-butylsilane, 1,3-disilabutane, bis(trimethylsilyl)methane, cyclopentadienyltrimethylsilane, phenyldimethylsilane, phenyltrimethylsilane, propargyltrimethylsilane, tetramethylsilane, trimethylsilylacetylene, 1-(trimethylsilyl)-1-propyne, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane and M silicate 51.

Examples of the decomposition gas for obtaining a ceramic layer by decomposing a source gas containing silicon include hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, water vapor, fluorine gas, hydrogen fluoride, trifluoroalcohol, trifluorotoluene, hydrogen sulfide, sulfur dioxide, carbon disulfide and chlorine gas.

By appropriately selecting a source gas containing silicon and a decomposition gas, a ceramic layer containing silicon oxide, nitride, carbide or the like can be obtained.

In the atmospheric pressure plasma CVD method, these reactive gases are mixed with principally a discharge gas that easily falls into a plasma state and the gas is fed into a plasma discharge generator. As such a discharge gas, nitrogen gas and/or an atom in the 18th group of the periodic table, specifically helium, neon, argon, krypton, xenon, radon or the like is used. Among them, particularly nitrogen, helium and argon are suitably used.

The discharge gas and the reactive gas are mixed, and supplied into an atmospheric plasma discharge generator (plasma generator) as a thin film forming (mixed) gas to form a film. The ratio of the discharge gas and the reactive gas varies depending on the nature of a film to be obtained, but the reactive gas is supplied with the ratio of the discharge gas being 50% or more based on the total mixed gas.

[Second Barrier Layer]

The second barrier layer of the embodiment according to the invention is formed as a layer containing silicon oxynitride by applying and laminating a coating solution preferably containing an inorganic compound onto the first barrier layer containing silicon, followed by subjecting the layer to a modification treatment. The formation method is not limited to the coating described above and the formation method used for the first barrier layer, or the like can be used.

As a coating method, any appropriate wet coating method can be applied. Specific examples include a spin coating method, a roll coating method, a flow coating method, an inkjet method, a spray coating method, a printing method, a dip coating method, a casting film formation method, a bar coating method and a gravure printing method. The coating thickness can be appropriately set according to a purpose as the second barrier layer. For example, the coating thickness is preferably about 1 nm to 100 μm, more preferably about 10 nm to 10 μm and most preferably about 10 nm to 1 μm in terms of post-drying thickness.

The inorganic compound used for formation of the second barrier layer (silicon oxynitride film) in the invention is not particularly limited but a polysilazane is preferably used from the viewpoint of formation of a barrier layer having low water vapor transmission rate.

The polysilazane mentioned in the invention is a polymer having a silicon-nitrogen bond and is a ceramic precursor inorganic polymer of $SiO_2$, $Si_3N_4$ and an intermediate solid solution of both, i.e. $SiO_xN_y$ or the like, which is composed of Si—N, Si—H, N—H and so on.

Particularly, for applying the second barrier layer without impairing the characteristics of the base or the first barrier layer that has been formed, a compound that is ceramized and altered into silica at a relatively low temperature. For example, a polysilazane compound having a main skeleton composed of a unit represented by the following general formula (1) as described in JP 8-112879A is preferable.

[Chemical Formula 1]

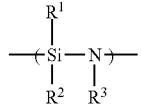

General Formula (1)

In the general formula (1), $R^1$, $R^2$ and $R^3$ each independently represents a hydrogen atom, alkyl group, alkenyl group, cycloalkyl group, aryl group, alkylsilyl group, alkylamino group or alkoxy group.

In the invention, a perhydropolysilazane in which all of $R^1$, $R^2$ and $R^3$ are hydrogen atoms is especially preferable from the viewpoint of denseness as the second barrier layer obtained.

On the other hand, an organopolysilazane in which a part of a hydrogen atom moiety bonded to Si is substituted with an alkyl group or the like has such an advantage that the adhesion with a base as a substrate is improved by virtue of having an alkyl group such as a methyl group and toughness can be imparted to a hard and fragile ceramic film of polysilazane. As a result generation of cracks is suppressed even when the (average) thickness is made larger. The perhydropolysilazane or organopolysilazane may be selected according to a purpose or they may be mixed and used.

The perhydropolysilazane is thought to have a structure in which a straight-chain structure and a ring structure having mainly a six-membered ring and eight-membered ring are present. It has a molecular weight of about 600 to 2000 (polystyrene equivalent) in terms of a number average molecular weight (Mn). It is a liquid or solid substrate and the state thereof varies depending on the molecular weight. The perhydropolysilazane is commercially available in the form of a solution in an organic solvent and the commercial product can be used directly as a polysilazane-containing coating solution.

Other examples of the polysilazane that is ceramized at a low temperature include a silicon alkoxide-addition polysilazane obtained by reacting a silicon alkoxide with the polysilazane having a main skeleton composed of a unit represented by the general formula (1) (see, for example, JP 5-238827A), a glycidol-addition polysilazane obtained by reacting a glycidol (see, for example, JP 6-122852A), an alcohol-addition polysilazane obtained by reacting an alcohol (see, for example, JP 6-240208A), a metal carboxylate-addition polysilazane obtained by reacting a metal carboxylate (see, for example, JP 6-299118A), an acetylacetonate complex-addition polysilazane obtained by reacting an acetylacetonate complex containing a metal (see, for example, JP 6-306329A), and a metal fine particle-addition polysilazane obtained by adding metal fine particles (see, for example, JP 7-196986A).

Further, besides the polysilazanes described above, a silsesquioxane can be used. Examples of the silsesquioxane include compounds of Q8 Series manufactured by Mayaterials Inc. such as Octakis(tetramethylammonium)pentacyclo-octasiloxane-octakis (yloxide)hydrate; Octa(tetramethylammonium) silsesquioxane, Octakis(dimethylsiloxy)octasilsesquioxane,
Octa[[3-[(3-ethyl-3-oxetanyl)methoxy]propyl]dimethylsiloxy] octasilsesquioxane; Octaallyloxetane silsesquioxane,
Octa[(3-Propylglycidylether)dimethylsiloxy] silsesquioxane;
Octakis[[3-(2,3-epoxypropoxy)propyl]dimethylsiloxy]octasilsesquioxane,
Octakis[[2-(3,4-epoxycyclohexyl)ethyl]dimethylsiloxy]octasilsesquioxane,
Octakis[2-(vinyl)dimethylsiloxy]silsesquioxane;
Octakis(dimethylvinylsiloxy)octasilsesquioxane,
Octakis[(3-hydroxypropyl)dimethylsiloxy]octasilsesquioxane,
Octa[(methacryloylpropyl)dimethylsilyloxy]silsesquioxane
Octakis[(3-methacryloxypropyl)dimethylsiloxy]octasilsesquioxane.

As an organic solvent for preparing a coating solution containing a polysilazane and so on, use of a solvent containing an alcoholic substance or moisture that easily reacts with polysilazane is not preferable. Therefore, specifically, a hydrocarbon solvent such as an aliphatic hydrocarbon, a cycloaliphatic hydrocarbon or an aromatic hydrocarbon, a halogenated hydrocarbon solvent, or an ether such as an aliphatic ether or a cycloaliphatic ether can be used. Specific examples include hydrocarbons such as pentane, hexane, cyclohexane, toluene, xylene, Solvesso and Tarben, halogenated hydrocarbons such as methylene chloride and trichloroethane, and ethers such as dibutyl ether, dioxane and tetrahydrofuran. These organic solvents may be selected according to characteristics such as the solubility of the polysilazane and the evaporation speed of the organic solvent and a plurality of organic solvents may be mixed.

The concentration of the polysilazane in the coating solution containing a polysilazane and so on varies depending on the desired thickness of the second barrier layer and the pot life of the coating solution, but is preferably about 0.2 to 35% by mass.

A catalyst of amine or metal can also be added into a polysilazane-containing coating solution for accelerating conversion into a silicon oxide compound. Specific examples include AQUAMICA NAX120-20, NN110, NN310, NN320, NL110A, NL120A, NL150A, NP110, NP140 and SP140 manufactured by AZ Electronic Materials S.A.

(Operation for Removing Organic Solvent and Moisture in Second Barrier Layer)

In the second barrier layer according to the invention, the second barrier layer formed by a polysilazane-containing coating solution is preferably subjected to an operation for removing moisture before or during a modification treatment. For this purpose, the operation is preferably divided into a first step intended for removing an organic solvent in the second barrier layer and a subsequent second step intended for removing moisture in the second barrier layer.

In the first step, principally an organic solvent is removed and therefore drying conditions can be appropriately determined such as a method of heat treatment or the like, and moisture may be removed at this time. The heat-treatment temperature is preferably high from the viewpoint of quick treatment, but it is preferable to appropriately determine the temperature and treatment time in consideration of thermal damage to a resin film base. For example, when a polyethylene terephthalate base having a glass transition temperature (Tg) of 70° C. is used as a resin base, the heat-treatment temperature can be set to 200° C. or lower. The treatment time is preferably set to a short time so that a solvent may be removed while thermal damage to the base may be reduced and it can be set to 30 minutes or less when the heat-treatment temperature is 200° C. or lower.

The second step is a step for removing moisture in the second barrier layer, and it is preferable to perform dehumidification by retaining the layer in a low-humidity environment as a method for removing moisture. The humidity in the low-humidity environment is changed with the temperature and therefore, a preferred mode of the relationship between the temperature and the humidity is determined by a definition of the dew-point temperature. A preferred dew-point temperature is 4° C. or lower (temperature 25° C./humidity 25%), the more preferred dew-point temperature is −8° C. (temperature 25° C./humidity 10%) or lower and the further preferred dew-point temperature 31° C. (temperature 25° C./humidity 1%) or lower. It is preferable to set the retained time appropriately according to the thickness of the second barrier layer. In such conditions that the thickness of the second barrier layer is 1.0 µm or less, it is preferable that the dew-point temperature be −8° C. or lower and the retained time be 5 minutes or less. Drying under reduced pressure may be performed for facilitating removal of moisture. For drying under reduced pressure, a pressure in a range of normal pressure to 0.1 MPa can be selected.

As preferred conditions of the second step with respect to the first step, for example, such conditions that moisture is removed with the dew-point of 4° C. or lower and the treatment time of 5 minutes to 120 minutes in the second step can be selected when a solvent is removed with the temperature of 60 to 150° C. and the treatment time of 1 minute to 30 minutes in the first step. The first step and the second step can be discriminated by a change in dew-point, and can be divided when the difference in dew-point in the process environment is 10° C. or higher.

The second barrier layer according to the invention is preferably subjected to a modification treatment while its state is retained after moisture is removed by the second step.

(Water Content of Second Barrier Layer)

The water content of the second barrier layer according to the invention can be measured in accordance with the analysis method shown below.
Head Space-Gas Chromatograph/Mass Spectrometry
Apparatus: HP6890GC/HP5973MSD
Oven: at 40° C. (2 min), followed by temperature elevation up to 150° C. at a rate of 10° C./min.
Column: DB-624 (0.25 mmid×30 m)
Inlet: 230° C.
Detector: SIM m/z=18
HS conditions: 190° C.-30 min The percentage of water content in the second barrier layer according to the invention is defined as a value obtained by dividing water content obtained from the above-mentioned analysis method by a volume of the second barrier layer. In a state with moisture removed by the second step, the percentage of water content is preferably 0.1% or less and further preferably 0.01% or less (detection limit or lower).

In the invention, removal of moisture before or during the modification treatment is preferable from the viewpoint of accelerating a dehydration reaction of the second barrier layer converted into silanol.

(Modification Treatment of Second Barrier Layer)

The modification treatment in the invention refers to a conversion reaction of a polysilazane compound into silicon oxynitride.

For the modification treatment in the invention, a known method can be selected based on the conversion reaction of the second barrier layer. Formation of a silicon oxynitride layer by a substitution reaction of a polysilazane compound requires a high temperature of 450° C. or higher, and is thus difficult to adapt in a flexible substrate such as a plastic or the like.

Therefore, when the gas barrier film of the embodiment according to the invention is prepared, a conversion reaction using plasma, ozone or an ultraviolet ray which allows the conversion reaction to be carried out at a lower temperature is preferable from the viewpoint of applicability to a plastic substrate.

(Ultraviolet Irradiation Treatment)

In the invention, a treatment by ultraviolet irradiation is also preferable as one of modification treatment methods. Ozone and active oxygen atoms generated by an ultraviolet ray (synonymous with ultraviolet light) have a high oxidization capability and is capable of forming a silicon oxide film or a silicon oxynitride film having high compactness and insulation quality at a low temperature.

The base is heated by this ultraviolet irradiation, $O_2$ and $H_2O$ contributing to ceramization (silica conversion), an ultraviolet absorber and a polysilazane itself are excited and activated, so that the polysilazane is excited, ceramization of the polysilazane is accelerated, and a ceramic film obtained becomes further compact (dense). Ultraviolet, irradiation is effective regardless of time point as long as it is performed after formation of a coated film.

In the method according to the invention, any ultraviolet generator that is usually used can be used.

The ultraviolet ray mentioned in the invention refers generally to an electromagnetic wave having a wavelength of 10 to 400 nm, but an ultraviolet ray having a wavelength of 210 to 350 nm is preferably used in the case of an ultraviolet irradiation treatment other than the vacuum ultraviolet (10 to 200 nm) treatment described later.

For irradiation of an ultraviolet ray, it is preferable to set the irradiation intensity and irradiation time within the bounds of not damaging the base supporting the second barrier layer which is to be irradiated.

When a plastic film is used as the base, for example, irradiation can be performed for 0.1 second to 10 minutes with a base-ultraviolet irradiation lamp distance set so that the strength at the base surface may be 20 to 300 $mW/cm_2$, preferably 50 to 200 $mW/cm^2$ using a lamp of 2 kW (80 $W/cm \times 25$ cm).

Generally, in the case of a plastic film or the like, the characteristics of the base are deteriorated such that the base is deformed or the strength thereof is degraded when the temperature of the base during the ultraviolet irradiation treatment becomes 150° C. or higher. However, in the case of a film of polyimide or the like, which has a high heat resistance, or a substrate of metal or the like, a modification treatment can be performed at a higher temperature. Therefore, the temperature of the base during ultraviolet irradiation does not have a general upper limit and can be appropriately set according to the type of the base by a person skilled in the art.

The ultraviolet irradiation atmosphere is not particularly limited and may be performed in the air.

Examples of the unit for generating an ultraviolet ray include, but are not limited to, a metal halide lamp, a high-pressure mercury lamp, low-pressure mercury lamp, a xenon arc lamp, a carbon arc lamp, an excimer lamp (single wavelength of 172 nm, 222 nm or 308 nm; manufactured by, for example, USHIO INC.) and an UV light laser. When the second barrier layer is irradiated with an ultraviolet ray generated, from the viewpoint of improving efficiency and achieving uniform irradiation, it is desirable to apply the ultraviolet ray from the generation source to the second barrier layer after reflecting the ultraviolet ray by a reflection plate.

Ultraviolet irradiation is applicable either to batch treatment or to continuous treatment, and a selection can be appropriately made according to the shape of a base that is used. For example, in the case of batch treatment, a base (e.g. silicon wafer) having the second barrier layer on the surface can be treated in an ultraviolet furnace including an ultraviolet generation source as described above. The ultraviolet furnace itself is generally known, and for example an ultraviolet furnace manufactured by EYE GRAPHICS Co., Ltd. can be used. When the base having the second barrier layer on the surface is in the form of a long film, it can be ceramized by continuously applying an ultraviolet ray in a drying zone including an ultraviolet generation source as described above while delivering the base. The required time for ultraviolet irradiation depends on the composition and concentration of the base used and the second barrier layer, but is generally 0.1 second to 10 minutes, preferably 0.5 seconds to 3 minutes.

(Vacuum Ultraviolet Irradiation Treatment: Excimer Irradiation Treatment)

In the invention, the most preferred modification treatment method is a treatment by vacuum ultraviolet irradiation (excimer irradiation treatment). The treatment by vacuum ultraviolet irradiation is a method of forming a silicon oxide film at a relatively low temperature by allowing an oxidization reaction by active oxygen and ozone to proceed while directly cutting the bond of atoms by the action of only photons, which is called a light quantum process, using light energy of 100 to 200 nm, which is greater than an interatomic bonding force within a polysilazane compound, preferably using energy of light having a wavelength of 100 to 180 nm.

As a vacuum ultraviolet light source required for the method, a rare gas excimer lamp is suitably used.

A rare gas of Xe, Kr, Ar, Ne or the like is called an inert gas because atoms thereof are not bonded to form a molecule. However, atoms of a rare gas which gain energy through a discharge or the like (excited atoms) can be bonded to other atoms to form a molecule. When the rare gas is xenon, the reaction of: e+Xe e+Xe→Xe*+Xe+ Xe→Xe2*+Xe proceeds, and excimer light of 172 nm is emitted when Xe2*, an excited excimer molecule, makes a transition into a ground state.

As a feature of the excimer lamp, efficiency is high because emission is focused on one wavelength and almost no light other than necessary light is emitted. In addition, the temperature of the object can be kept low because unnecessary light is not emitted. Further, instant lighting/flashing is possible because little time is required for starting/restarting.

A method using a dielectric barrier discharge is known for obtaining an excimer light emission. The dielectric barrier discharge is a very thin discharge similar to a thunder, called a micro discharge, which is generated in a gas space by applying a high-frequency high voltage of several tens of kHz to electrodes provided in the gas space in which a dielectric substance (transparent quartz in the case of the excimer lamp) is interposed between the electrodes. When a streamer of the micro discharge arrives at the tube wall (of the dielectric substance), charges are accumulated on the surface of the dielectric substance, so that the micro discharge disappears. This micro discharge spreads over the entire tube wall and is generated/disappears repeatedly. Thus, flickering of light recognized by naked eyes occurs. Since the streamer of a very high temperature arrives directly at the tube wall on the local basis, degradation of the tube wall may be accelerated.

Besides the dielectric barrier discharge, an electrodeless field discharge can also be used as a method for efficiently obtaining an excimer light emission.

It is an electrodeless field discharge by capacitive bonding, and is also called an RF discharge as a different name. The lamp and electrodes and arrangement thereof may be basically same as those in the dielectric barrier discharge but lighting is established by applying a high frequency of several MHz between both electrodes. In the electrodeless field discharge, a discharge which is uniform in terms of space and time is obtained as described above and therefore a long-life lamp free from flickering is obtained.

In the case of the dielectric barrier discharge, the micro discharge is generated only between electrodes and therefore, for an effective discharge in the entire discharge space, the outside electrode should be provided so as to cover the entire outer surface and allow light to penetrate so as to take out light to outside. Thus, an electrode with thin metallic wires formed into a meshwork is used. This electrode is liable to damage by ozone or the like generated by vacuum ultraviolet light especially in an oxygen atmosphere because wires as thin as possible are used so as not to block light.

For preventing the problem, it is required that the periphery of the lamp, i.e. the interior of the irradiation apparatus, be brought into an atmosphere of an inert gas such as nitrogen and a window of synthetic quartz be provided to take out irradiation light. The window of synthetic quartz is not only an expensive consumable article but also causes a loss of light.

A double cylinder-type lamp has an outer diameter of about 25 mm, so that a difference between distances to irradiation surfaces at a position immediately below the lamp shaft and a position at a side of the lamp cannot be ignored, and thus the intensity of illumination becomes much different between the positions. Therefore, a uniform illumination distribution cannot be obtained even if such lamps are arranged in closely contact with one another. If an irradiation apparatus provided with a window of synthetic quartz is used, the distance in the oxygen atmosphere can be equalized so that a uniform illumination distribution is obtained.

When an electrodeless field discharge is used, it is not necessary to make the outer electrode be in the form of a meshwork. A glow discharge spreads over the entire discharge space merely by providing an outer electrode on a part of the outer surface of the lamp. An electrode which is made normally of an aluminum block and also serves as a light reflecting plate is provided on the back surface of the lamp as the outer electrode. However, since the outer diameter of the lamp is large as in the case of the dielectric barrier discharge, synthetic quartz is required for providing a uniform illumination distribution.

The most significant feature of a narrow tube excimer lamp is a simple structure. A quartz tube is merely filled therein with a gas for performing excimer light emission with the quartz tube closed at both ends. Therefore, a very inexpensive light source can be provided.

Since the double cylinder-type lamp is processed so that inner and outer tubes are connected and closed at both ends, it is liable to damage through handling and transportation as compared to the narrow-tube lamp. The outer diameter of the tube of the narrow-tube lamp is about 6 to 12 mm and if the lamp be too thick, a high voltage is needed for starting.

For the form of discharge, either a dielectric barrier discharge or an electrodeless field discharge can be used. The electrode may have such a shape that a surface in contact with the lamp is flat. But if the surface be shaped in conformity with the curved surface of the lamp, the lamp can be firmly fixed and the electrode is in close contact with the lamp, so that the discharge becomes more stable. The curved surface, if formed into a mirror surface with aluminum, serves as a light reflecting plate.

A Xe excimer lamp emits an ultraviolet ray having a short wavelength of 172 nm in a single wavelength and is therefore excellent in light emission efficiency. The light has a large oxygen absorption coefficient, so that radical oxygen atom species and ozone can is generated in a high concentration with a very small amount of oxygen. Energy of light having a short wavelength of 172 nm, which causes a bond of organic substances to be dissociated, is known to have a high capability. Owing to the active oxygen and ozone and high energy possessed by ultraviolet radiations, modification of the polysilazane film can be achieved in a short time. Therefore, in contrast to a low-pressure mercury lamp that emits light having wavelengths of 185 nm and 254 nm or plasma cleaning, shortening of processing time associated with a high throughput, reduction of an area for facilities and irradiation to organic materials, plastic substrates and the like which are liable to damage by heat, can be achieved.

The excimer lamp has high efficiency of emission of light and therefore can be lit by introduction of a low power. In addition, the excimer lamp has such a feature that elevation of the temperature of the surface of an irradiation object is suppressed because light of a long wavelength, which causes temperature elevation by light, is not emitted but energy of a single wavelength in the ultraviolet range is applied. Thus, the excimer lamp is suitable for flexible film materials, such as polyethylene terephthalate, which are easily affected by heat.

Modification treatment conditions are not limited but, for example, when the thickness of the second barrier layer is assumed to be 50 to 1000 nm, the conditions may be selected from following conditions of: vacuum ultraviolet illuminance of 10 to 200 mJ/cm$^2$, irradiation distance of 0.1 to 10 mm, oxygen concentration, of 0 to 5%, dew-point temperature of 10 to −50° C., temperature of 25 to 200° C. and treatment time of 0.1 to 150 sec.

[Structure of Gas Barrier Film]
(Base:Base)

The base of the gas barrier film of an embodiment according to the invention (hereinafter, also referred to as a base) is not particularly limited as long as it is formed of an organic material that can hold gas barrier layers (first barrier layer and second barrier layer) having gas barrier properties.

Examples may include various resin films of acrylate, methacrylate, polyethylene terephthalate (PET), polybutylene terephthalate, polyethylene naphthalate (PEN), polycarbonate (PC), polyallylate, polyvinyl chloride (PVC), polyethylene (PE), polypropylene (PP), polystyrene (PS), nylon (NY), aromatic polyamide, polyetheretherketone, polysulfone, polyethersulfone, polyimide, polyetherimide and so on, a heat-resistant transparent film having, as a, basic structure, silsesquioxane having an organic-inorganic hybrid structure (product name: Sila-DEC manufactured by CHISSO CORPORATION), and resin films formed by laminating two or more layers of the aforementioned resin. Polyethylene terephthalate (PET), polybutylene terephthalate, polyethylene naphthalate (PEN), polycarbonate (PC)

and so on are suitably used in terms of costs and ease of acquisition, and the heat-resistant transparent film having, as a basic structure, silsesquioxane having an organic-inorganic hybrid structure can be suitably used in terms of optical transparency, heat resistance and adhesion with the first barrier layer and gas barrier layer. The thickness of the base is preferably about 5 to 500 μm, and further preferably 25 to 250 μm.

The base of the embodiment according to the invention is preferably transparent. This is because when the base is transparent and layers formed on the base are also transparent, a transparent gas barrier film can be formed and therefore a transparent substrate for an electronic device such as an organic EL element can also be formed.

The base using the above-mentioned resin or the like may be an unstretched (unoriented) film or may be a stretched (oriented) film.

The base for use in the invention can be produced by a previously well-known general method. For example, by melting a resin as a material by an extruder, and extruding the molten resin through a ring die or a T-die to be rapidly cooled, an unstretched base, which is substantially amorphous and is not oriented, can be produced. A stretched base can be produced by drawing an unstretched base in a base-flowing direction (longitudinal direction) or a direction normal to the base-flawing direction (lateral direction) by a well-known method such as uniaxial stretching, tenter type sequential biaxial stretching, tenter type simultaneous biaxial stretching or tubular simultaneous biaxial stretching. The stretching ratio in this case can be appropriately selected according to a resin as a raw material of the base, but is preferably 2 to 10 in each of longitudinal and lateral directions.

The base according to the invention can be subjected to a corona treatment before the first barrier layer is formed.

Further, an anchor coat layer may be formed on the surface of the base according to the invention for the purpose of improving adhesion with the first barrier layer. As anchor coating agent use for the anchor coat layer, a polyester resin, an isocyanate resin, a urethane resin, an acryl resin, an ethylene vinyl alcohol resin, a vinyl-modified resin, an epoxy resin, a modified styrene resin, a modified silicon resin, an alkyl titanate and the like can be used alone or in combination of two or more thereof. To these anchor coating agents can also be added a previously well-known additive. The above-described anchor coating agent can be coated by applying it onto the base by a well-known method such as roll coating, gravure coating, knife coating, dip coating or spray coating, and removing a solvent, a diluent and the like by drying. The coating amount of the above-described anchor coating agent is preferably about 0.1 to 5 g/m$^2$ (dry state).

(Smooth Layer)

The gas barrier film of the embodiment according to the invention may have a smooth layer as a primary layer at a position as shown in FIG. 2. The smooth layer is provided for flattening the rough surface of a transparent resin film base, on which projections and the like are present, or flattening the transparent first barrier layer by filling up unevenness and pinholes generated thereon by projections present on the transparent resin film base. Such a smooth layer is formed principally by curing a photosensitive resin.

Examples of the photosensitive resin used for formation of the smooth layer include a resin composition containing an acrylate compound having a radical-reactive unsaturated compound, a resin composition containing an acrylate compound and a mercapto compound having a thiol group, and a resin compound with a polyfunctional acrylate monomer dissolved therein such as epoxy acrylate, urethane acrylate, polyester acrylate, polyether acrylate, polyethylene glycol acrylate or glycerol methacrylate. Any mixture of the resin compositions described above can also be used, and the photosensitive resin is not particularly limited as long as it contains a reactive monomer having at least one photopolymerizable unsaturated bond in a molecule.

Examples of the reactive monomer having at least one photopolymerizable unsaturated bond in a molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethylhexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethylhexyl acrylate, glycerol acrylate, glycidyl acrylate, 2-hydroxyethyl acrylate, 2-hydroxypropyl acrylate, isobonyl acrylate, isodecyl acrylate, isooctyl acrylate, laurel acrylate, methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexadiol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyltrimethylolpropane triacrylate, pentaerythritol triacrylate, pentaerythritol tetraacrylate, ethylene oxide-modified pentaerythritol triacrylate, ethylene oxide-modified pentaerythritol tetraacrylate, propione oxide-modified pentaerythritol triacrylate, propione oxide-modified pentaerythritol tetraacrylate, triethylene glycol diacrylate, polyoxypropyltrimethylolpropane triacrylate, butylene glycol diacrylate, 1,2,4-butanediol triacrylate, 2,2,4-trimethyl-1,3-pentadiol diacrylate, diallyl fumalate, 1,10-decanedioldimethyl acrylate, pentaerythritol hexaacrylate, those with the acrylate of the above-mentioned monomers replaced by methacrylate, γ-methacryloxypropyltrimethoxysilane and 1-vinyl-2-pyrrolidone. The reactive monomers described above can be used alone or as a mixture of two or more thereof, or a mixture with other compounds.

The composition of the photosensitive resin contains a photopolymerization initiator.

Examples of the photopolymerization initiator include benzophenone, methyl o-benzoylbenzoate, 4,4-bis(dimethylamine)benzophenone, 4,4-bis(diethylamine)benzophenone, α-amino-acetophenone, 4,4-dicyclobenzophenone, 4-benzoyl-4-methyldiphenylketone, dibenzylketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-amylanthraquinone, β-chloroanthraquinone, anthrone, benzanthrone, dibenzsuberon, methyleneanthrone, 4-azidobenzylacetophenone, 2,6-bis(p-azidobenzylidene)cyclohexane, 2,6-bis(p-azidobenzylidene)cyclohexane-4-methylcyclohexanone, 2-phenyl-1,2-butanedione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl[4-(methylthio)phenyl]-2-monopholino-1-propane, 2-benzyl-2-dimethylamino-1-(4-monopholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoin peroxide, and combinations of photo-reductive dyes such as eosin and methylene blue and reducing agents such as ascorbic acid and triethanolamine, and these photopolymerization initiators can be alone or in combination of two or more thereof.

The method of forming the smooth layer is not particularly limited but a wet coating method such as a spin coating method, a spray method, a blade coating method or a dipping method, or a dry coating method such as a vapor deposition method is preferable.

In formation of the smooth layer, additives such as an antioxidant, an ultraviolet ray absorber and a plasticizer can be added to the above-mentioned photosensitive resin as necessary. In any smooth layers, regardless of the position at which the smooth layer is laminated, resins and additives suitable for improvement film formability and prevention of generation of pinholes in the film or the like may be added.

Examples of the solvent used when the smooth layer is formed using a coating solution with a photosensitive resin dissolved or dispersed in a solvent may include alcohols such as methanol, ethanol, n-propanol, isopropanol, ethylene glycol and propylene glycol, terpenes such as α- or β-terpineol, ketones such as acetone, methyl ethyl ketone, cyclohexanone, N-methyl-2-pyrrolidone, diethyl ketone, 2-heptanone and 4-heptanone, aromatic hydrocarbons such as toluene, xylene and tetramethylbenzene, glycol ethers such as cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether and triethylene glycol monoethyl ether, acetates such as ethyl acetate, butyl acetate, cellosolve acetate, ethyl cellosolve acetate, butyl cellosolve acetate, carbitol acetate, ethyl carbitol acetate, butyl carbitol acetate, propylene glycol monomethyl ether acetate, propylene glycol monoethyl ether acetate, 2-methoxyethyl acetate, cyclohexyl acetate, 2-ethoxyethyl acetate and 3-methoxybutyl acetate, diethylene glycol dialkyl ethers, dipropylene glycol dialkyl ethers, ethyl 3-ethoxypropionate, methyl benzoate, N,N-dimethylacetamide and N,N-dimethylformamide.

The smoothness of the smooth layer is preferably 10 nm or more and 30 nm or less in terms of the maximum cross-sectional height Rt (p), a value expressed as a surface roughness as defined in JIS B 0601. If the surface roughness is less than 10 nm, coatability may be impaired when a coating means becomes in contact with the surface of the smooth layer by a coating method with a wire bar, a wireless bar or the like, at a stage of applying a silicon compound as described later. If the surface roughness is more than 30 nm, it may become difficult to smooth unevenness after a silicon compound is applied.

The surface roughness is calculated from a cross-sectional curve of unevenness which is continuously measured by a detector having a probe having a minimal tip radius in an atomic force microscope (AFM). It is a roughness associated with the amplitude of very small unevenness, which is determined by making multiple measurements within a section of several tens of μm in the measurement direction using a probe having a minimal tip radius.

(Additives to Smooth Layer)

One of preferred aspects includes, in a photosensitive resin, reactive silica particles in which a photosensitive group having a photopolymerization reactivity is introduced to the surface (hereinafter, also referred to simply as "reactive silica particles"). Here, examples of the photosensitive group having a photopolymerizability may include polymerizable unsaturated groups represented by a (meth)acryloyloxy group. The photosensitive resin may contain a compound capable of undergoing a photopolymerization reaction with the photosensitive group having a photopolymerization reactivity introduced to the surfaces of reactive silica particles, that is, an unsaturated organic compound having a polymerizable unsaturated group, for example. The solid content of the photosensitive resin may be adjusted by appropriately mixing general-purpose diluent solvent with the reactive silica particles or unsaturated organic compound having a polymerizable unsaturated group.

Here, the average particle diameter of the reactive silica particles is preferably 0.001 to 0.1 μm. By ensuring that the average particle diameter falls within this range, a smooth layer having both optical characteristics that satisfy a glare resistance and a resolution as an effect of the invention in good balance and hard coat characteristics is easily formed by using the reactive silica particles in combination with a matting agent composed of inorganic particles having an average particle diameter of 1 to 10 μm as described later. Use of reactive silica particles having an average particle diameter of 0.001 to 0.01 μm is more preferable from the viewpoint of ensuring that the effect described above is more easily obtained. The smooth layer used in the invention preferably contains the above-mentioned inorganic particles in an amount of 20% or more and 60% or less in terms of the mass ratio. By adding the inorganic particles in an amount of 20% or more, adhesion with the gas barrier layer is improved. When the ratio becomes more than 60%, cracks may be generated when the film is curved or a heating treatment is carried out, or optical properties such as a transparency and a refractive index of the gas barrier film may be affected.

In the invention, such a material that a polymerizable unsaturated group-modified hydrolyzable silane is chemically bonded by generating a silyloxy group between itself and a silica particle by a hydrolysis reaction of a hydrolyzable silyl group can be used as the reactive silica particle.

Examples of the hydrolyzable silyl group include a carboxy-silylate silyl group such as an alkoxysilyl group or an acetoxysilyl group, a halogenated silyl group such as a chlosilyl group, an aminosilyl group, an oxime silyl group and a hydridesilyl group.

Examples of the polymerizable unsaturated group include an acryloyloxy group, methacryloyloxy group, a vinyl group, a propenyl group, a butadienyl group, a styryl group, an ethynyl group, a cinnamoyl group, a malate group and an acrylamide group.

In the invention, it is desirable that the thickness of the smooth layer be 1 to 10 μm and preferably 2 to 7 μm. By ensuring that the thickness is 1 μm or more, the smoothness as a film having a smooth layer is easily made sufficient and by ensuring that the thickness is 10 μm or less, the balance of the optical characteristics of the smooth film is easily adjusted and curls of the smooth film can be easily suppressed when the smooth layer is provided only on one surface of the transparent polymer film.

(Bleed-Out Preventing Layer)

In the gas barrier film of the embodiment according to the invention, a bleed-out, preventing layer can be provided as a primary layer as shown in FIG. 2. The bleed-out preventing layer is provided on the opposite surface of the base having a smooth layer for the purpose of suppressing such a phenomenon that unreacted oligomers and so on are transferred from the interior to the surface of the film base to contaminate the contact surface when the film having the smooth layer is heated. The bleed-out preventing layer may have essentially the same structure as that of the smooth layer as long as it has the function described above.

As an unsaturated organic compound having a polymerizable unsaturated group, which can be included in the bleed-out preventing layer, a polyvalent unsaturated organic compound having two or more polymerizable unsaturated groups in a molecule or a monovalent unsaturated organic compound having one polymerizable unsaturated group in a molecule may be taken as an example.

Here, examples of the polyvalent unsaturated organic compound include ethylene glycol di(meth)acrylate, diethylene glycol di(meth)acrylate, glycerol di(meth)acrylate, glycerol tri(meth)acrylate, 1,4-butanediol di(meth)acrylate, 1,6-hexanediol di(meth)acrylate, neopentyl glycol di(meth) acrylate, trimethylolpropane tri(meth)acrylate, dicyclopentanyl di(meth)acrylate, pentaerythritol tri(meth)acrylate, pentaerythritol tetra(meth)acrylate, dipentaerythritol hexa (meth)acrylate, dipentaerythritol monohydroxy penta(meth) acrylate, ditrimethylolpropane tetra(meth)acrylate, diethylene glycol di(meth)acrylate, polyethylene glycol di(meth) acrylate, tripropylene glycol di(meth)acrylate and polypropylene glycol di(meth)acrylate.

Examples of the monovalent unsaturated organic compound include methyl (meth)acrylate, ethyl (meth)acrylate, propyl (meth)acrylate, butyl (meth)acrylate, 2-ethylhexyl (meth)acrylate, isodecyl (meth)acrylate, lauryl (meth)acrylate, stearyl (meth)acrylate, allyl (meth)acrylate, cyclohexyl (meth)acrylate methylcyclohexyl (meth)acrylate isobornyl (meth)acrylate, 2-hydroxyethyl (meth)acrylate, 2-hydroxypropyl (meth)acrylate, glycerol (meth)acrylate, glycidyl (meth)acrylate, benzyl (meth)acrylate, 2-ethoxyethyl (meth) acrylate, 2-(2-ethoxyethoxy)ethyl (meth)acrylate, butoxyethyl (meth)acrylate, 2-methoxyethyl (meth)acrylate, methoxy diethylene glycol (meth)acrylate, methoxy triethylene glycol (meth)acrylate, methoxy polyethylene glycol (meth)acrylate 2-methoxypropyl (meth)acrylate, methoxy dipropylene glycol (meth)acrylate, methoxy tripropylene glycol (meth)acrylate, methoxy polypropylene glycol (meth)acrylate, polyethylene glycol (meth)acrylate and polypropylene glycol (meth)acrylate.

As other additives, a matting agent may be contained. As the matting agent, inorganic particles having an average particle diameter of about 0.1 to 5 µm are preferable.

As these inorganic particles, silica, alumina, talk, clay, calcium carbonate, magnesium carbonate, barium sulfate, aluminum hydroxide, titanium dioxide, zirconium oxide and the like can be used alone or in combination of two or more thereof.

Here, it is desirable that the matting agent formed of inorganic particles be mixed at a ratio of 2 parts by mass or more, preferably 4 parts by mass or more and more preferably 6 parts by mass or more and 20 parts by mass or less, preferably 18 parts by mass or less and more preferably 16 parts by mass or less based on 100 parts by mass of the solid content of the hard-coating agent.

The bleed-out preventing layer may contain a thermoplastic resin, a thermosetting resin, an ionizing radiation-curable resin, a photopolymerization initiator and so on as components other than the hard-coating agent and matting agent.

Examples of the thermoplastic resin include cellulose derivatives such as acetyl cellulose, nitrocellulose, acetyl butyl cellulose, ethyl cellulose and methyl cellulose, vinyl-based resins such as vinyl acetate and copolymers thereof, vinyl chloride and copolymers thereof and vinylidene chloride and copolymers thereof, acetal-based resins such as polyvinyl formal and polyvinyl butyral, acryl-based resins such as an acryl resin and copolymers thereof and a methacryl resin and copolymers thereof, a polystyrene resin, a polyamide resin, a linear polyester resin and a polycarbonate resin.

Examples of the thermosetting resin include a thermosetting urethane resin formed of an acrylic polyol and an isocyanate prepolymer, a phenol resin, a urea melamine resin, an epoxy resin, an unsaturated polyester resin and a silicone resin.

As the ionizing radiation-curable resin, one that is cured by applying an ionizing radiation (ultraviolet ray or electron beam) to an ionizing radiation-curable coating prepared by mixing one or more of photopolymerizable prepolymers, photopolymerizable monomers and so on can be used. An acryl-based prepolymer, which has two or more acryloyl groups in one molecule and is formed into a three-dimensional meshwork structure by crosslinking-curing, is especially suitably used as the photopolymerizable prepolymer. A urethane acrylate, polyester acrylate, epoxy acrylate, melamine acrylate or the like can be used as the acryl-based prepolymer. The polyvalent unsaturated organic compound described above, or the like can be used as the photopolymerizable monomer.

Examples of the photopolymerization initiator include acetophenone, benzophenone, Michler's ketone, benzoin, benzyl methyl ketal, benzoin benzoate, hydroxycyclohexyl phenyl ketone,
2-methyl-1-(4-(methylthio)phenyl)-2-(4-morpholinyl)-1-propane, α-acyloxime ester and thioxanthones.

The bleed-out preventing layer described above can be formed by mixing a hard-coating agent, a matting agent and other components as necessary, preparing a coating solution from the mixture with a diluent solvent that is appropriately used as necessary, coating the surface of the base film with the coating solution by a previously well-known coating method, and thereafter curing the coated film by applying an ionizing radiation. A process for applying an ionizing radiation can be carried out by applying an ultraviolet ray having a wavelength in a range of 100 to 400 nm and preferable of 200 to 400 nm, which is emitted from an ultra-high pressure mercury lamp, a high pressure mercury lamp, a low pressure mercury lamp, a carbon arc, a metal halide lamp or the like, or applying an electron beam having a wavelength in a range of no more than 100 nm, which is emitted from a scan-type or curtain-type electron beam accelerator.

It, is desirable that the thickness of the bleed-out preventing layer in the invention be 1 to 10 µm and preferably 2 to 7 µm. By ensuring that the thickness is 1 µm or more, the heat resistance as a film is easily made sufficient, and by ensuring that the thickness is 10 µm or less, the balance the optical characteristics of the smooth film is easily adjusted and curls of the barrier film can be easily suppressed in a case where the smooth layer is provided on one surface of the transparent polymer film.

<Package Configuration of Gas Barrier Film>

The gas barrier film of the embodiment according to the invention can be produced by so called a roll-to-roll method in which the film is continuously produced and wound in the form of a roll. At this time, it is preferable to wind the film with a protective sheet bonded to a surface on which a barrier layer is formed. Particularly, when the gas barrier film of the embodiment according to the invention is used as a sealing material for an organic thin film device, there are many cases where defects are caused by contaminants (particles) deposited on the surface and it is very effective to prevent deposition of contaminants by bonding a protective sheet in a place where the cleanliness level is high. At the same time, scars generated on the surface of the gas barrier layer at the time of winding the film are effectively prevented.

The protective sheet is not particularly limited, but a general "protective sheet" or "peel-off sheet" having a structure in which a resin substrate having a thickness of about 100 μm is provided with weak-adhesive adhesion layer.

<Method for Measuring Characteristic Value of Gas Barrier Film>

The characteristic values of the gas barrier film of the embodiment according to the invention can be measured in accordance with the methods described below.

[Measurement of Water Vapor Transmission Rate]

Generally, various methods have been proposed for measuring water vapor transmission rate. Representative examples include a cup method, a dry-wet sensor method (Lassy method) and an infrared sensor method (mocon method) but a measurement limit may be reached in these methods as gas barrier properties are improved. Besides the above-described methods, the following methods with high measurement accuracy have been proposed.

<Water Vapor Transmission Rate Measurement Methods with High Measurement Accuracy>

1. Ca Method

Metal Ca is deposited on a gas barrier film and a phenomenon of corrosion of the metal Ca by moisture passed through the film is used. The water vapor transmission rate is calculated from a corrosion area and a time for reaching there.

2. Method Proposed by MORESCO Corporation (News Release on Dec. 8, 2009)

Transfer is conducted through a cooling trap of water vapor between a sample space under atmospheric pressure and a mass spectrometer in ultra-high vacuum.

3. HTO Method (General Atomics Inc. (U.S.A.))

Water vapor transmission rate is calculated using tritium.

4. Method Proposed by A-Star (Singapore) (International Publication No. 005/95924)

A material whose electrical resistance is changed by water vapor or oxygen (e.g. Ca or Mg) is used as a sensor and water vapor transmission rate is calculated from a change in electrical resistance and a 1/f fluctuation component existing therein.

In the gas barrier film of the embodiment according to the invention, the method for measuring water vapor transmission rate is not particularly limited but in the invention, measurements were made by the Ca method described below as a water vapor transmission rate measurement method.

<Ca Method Used in the Embodiment According to the Invention>

Vapor deposition apparatus: Vacuum deposition apparatus JEE-400 manufactured by JEOL Ltd., Constant temperature and humidity oven (the mo- and humidistat oven): Yamato Humidic Chamber IG47M Metal corroded by reaction with moisture: calcium (granular)

Metal impermeable to water vapor: aluminum ($\phi$ 3 to 5 mm; granular)

Preparation of Cell for Evaluation of Water Vapor Barrier Properties

Metal calcium deposited on the surface of a gas barrier layer of a barrier film sample using a vacuum deposition apparatus (vacuum deposition apparatus JEE-400 manufactured by JEOL Ltd.,) while a section other than sections intended for deposition (9 sections each having a size of 12 mm×12 mm) on the barrier film sample before deposition of a transparent conductive film were masked. Thereafter, the mask was removed in the vacuum state, and aluminum was deposited on the entire surface at the other side of the sheet from a metal evaporation source. After aluminum was deposited, the vacuum state was released and the aluminum-sealing-side of the sample was faced to a quartz glass having a thickness of 0.2 mm with a ultraviolet curable resin for sealing (manufacture by Nagase ChemteX Corporation) between them and it was irradiated with an ultraviolet ray under an atmosphere of dry nitrogen gas, so that a cell for evaluation was prepared quickly. For checking a change in gas barrier properties before and after bending, a cell for evaluation of water vapor barrier properties was also prepared in the same manner for a barrier film that was not subjected to the bending treatment.

The obtained sample, the both surfaces of which were sealed, was stored under high-temperature and high-humidity conditions of 40° C. and 90% RH and 60° C. and 90% RH, and the amount of moisture passing into the cell was calculated from the corrosion amount of metal calcium according to the method described in JP 2005-2835561 A.

For confirming that water vapor passed only from the surface of the barrier film, a sample prepared by depositing metal calcium using a quartz glass having a thickness of 0.2 mm was stored under high-temperature and high-humidity conditions of 40° C. and 90% RH and 60° C. and 90% RH as a comparative sample in place of the barrier film sample, so that it was confirmed that corrosion of metal calcium did not occur even after elapse of 1000 hours.

Further, the gas barrier film of the embodiment according to the invention also exhibits an excellent characteristic with respect to bending.

For example, the gas barrier film of the embodiment according to the invention has such a characteristic that the water vapor transmission rate for an untreated sample is not significantly deteriorated when the water vapor transmission rate is measured according to the above-described method after the film is subjected to a bending operation.

<Field of Application of Gas Barrier Film>

The gas barrier film of the embodiment according to the invention is applicable to an electronic device.

Specifically, the gas barrier film having a high level of water vapor and oxygen barrier properties according to the invention can be used as a sealing material and a sealing film for various electronic devices.

The gas barrier film of the embodiment according to the invention can be used for a display element, for example an organic electroluminescence element (hereinafter, abbreviated as an organic EL). The gas barrier film of the embodiment according to the invention is transparent and therefore when it is used for the organic EL element, the organic EL element can be constituted such that this barrier film is used as a base and light is taken out from the side of the base. That is, for example, a resin base for an organic electroluminescence element can be formed by providing a transparent conductive thin film of ITO or the like on the gas barrier film as a transparent electrode. The ITO transparent conductive film provided on the base is set as an anode, an organic EL material layer including a light-emitting layer is provided thereon, a cathode composed of a metal film is further formed to form an organic EL element, a different-type (may be the same-type) sealing material is laminated thereon, so that the gas barrier film base and the periphery are bonded together to confine the element, whereby an organic EL element layer can be sealed and consequently influences on the element by humidity of outside air and gases such as oxygen can be prevented.

The organic EL light-emitting device has the problem that light take-out efficiency is low. Therefore, it is preferable to have a structure for improvement of light take-out as well when the gas barrier film is used as a film substrate.

Therefore, the gas barrier film of the embodiment according to the invention, when used as a resin base for an organic electroluminescence element, preferably has on the surface a shape of unevenness for diffracting or scattering light in order to improve light take-out efficiency from the organic EL element.

The gas barrier film of the embodiment according to the invention can be applied to a sealing film.

In the process of producing an organic EL, a transparent conductive film is formed on a ceramic film and set as an anode, an organic EL material layer that forms an organic EL element and a metal layer that forms a cathode are laminated thereon, and another gas barrier film is further superimposed and bonded thereon as a sealing film to perform sealing. As the another sealing material (sealing film) as described above, a gas barrier film having a ceramic film having a dense structure according to the invention can be used.

An organic EL material using the gas barrier film of the embodiment according to the invention is advantageously used for various kinds of light-emitting light sources, household illuminations and vehicle illuminations as illuminators, and backlight of a liquid display apparatus and the like as a type of lamp such as an exposure light source for a display apparatus.

The gas barrier film can be used for the sealing film of organic photoelectric conversion elements as other electronic devices.

When the gas barrier film of the embodiment according to the invention is used for the organic photoelectric conversion element, the organic photoelectric conversion element can be constituted such that this gas barrier film is used as a base and sunlight is received from a side at which the gas barrier film is placed because the gas barrier film of the embodiment according to the invention is transparent. That is, for example, a resin base for an organic photoelectric conversion element can be formed by providing a transparent conductive thin film of ITO or the like as a transparent electrode on the gas barrier film. The ITO transparent conductive film provided on the base is set as an anode, a porous semiconductor layer is provided thereon, a cathode composed of a metal film is further formed to form an organic photoelectric conversion element, a different-type (may be the same-type) sealing material is laminated thereon, so that the gas barrier film base and the periphery are bonded together to confine the element, whereby the organic photoelectric conversion element can be sealed and consequently influences on the organic photoelectric conversion element by humidity of outside air and gases such as oxygen can be prevented.

EXAMPLES

Example 1

Preparation of Gas Barrier Film

[Preparation of Sample 1]
(Formation of First Barrier Layer 1)
Using a vacuum plasma CVD apparatus shown in FIG. 3, a SiON film was formed on a transparent resin base (polyethylene naphthalate (PEN) film with a clear hard coat layer (CHC) manufactured by KIMOTO CO., LTD. (thickness of PEN: 125 µm; thickness of CHC: 6 µm)) under the following film formation conditions. The high-frequency power source used at this time was a high-frequency power source at 27.12 MHz, and the distance between electrodes was 20 mm. As source gases, a monosilane ($SiH_4$) gas at a flow rate of 7.5 sccm, an ammonia gas at a flow rate of 100 sccm and a nitrous oxide gas at a flow rate of 50 sccm were introduced into a vacuum chamber. The temperature of a film substrate was set to 100° C.' and the gas pressure during film formation was set to 0.1 Pa at the start of film formation, and a silicon oxynitride film (SiON layer) having silicon nitride as a main component was formed in a thickness of 200 nm, so that a first barrier layer 1 was formed.

(Formation of Second Barrier Layer 1)
A 10% mass dibutyl ether solution of perhydropolysilazane (AQUAMICA NN 120-10; non-catalyst type; manufactured by AZ Electronic Materials S.A.) was applied with a wireless bar onto the first barrier layer 1 formed by the above-described method so that the post-drying (average) thickness became 100 nm, followed by carrying out the treatments described below.

<First Step: Drying Treatment>
The obtained coated sample was treated under an atmosphere of temperature of 85° C. and humidity of 55% RH for 1 minute to obtain a dry sample.

<Second Step: Dehumidification, Treatment>
The dried sample was further held under an atmosphere of temperature of 25° C. and humidity of 10% RH (dew-point temperature: −8° C.) for 10 minutes to perform a dehumidification treatment.

<Modification Treatment>
The sample subjected to the dehumidification treatment was subjected to a modification treatment under the conditions described below. The dew-point temperature during the modification treatment was −8° C.

<Modification Treatment Apparatus>
Apparatus: Excimer irradiation apparatus MODEL MECL-M-1-200 manufactured by M.D.COM, inc.
Wavelength: 172 nm
Lamp filling gas: Xe <Modification Treatment Conditions>
A sample fixed on an operation stage was subjected to a modification treatment under the following conditions to form a second barrier layer 1.
Excimer light intensity: 130 mW/$cm^2$ (172 nm)
Distance between sample and light source: 1 mm
Stage heating temperature: 70° C.
Concentration of oxygen in irradiation apparatus: 1.0%
Excimer irradiation time: 5 seconds A sample 1 as a gas barrier film was prepared in the manner described above.

[Preparation of Sample 2]
A sample 2 was prepared in the same manner as in preparation of the sample 1 described above except that the thickness of the first barrier layer 1 was changed from 200 nm to 100 nm.

[Preparation of Sample 3]
A sample 3 was prepared in the same manner as in preparation of the sample 1 described above except that the thickness of the first barrier layer 1 was changed from 200 nm to 50 nm.

[Preparation of Sample 4]
A sample 4 was prepared in the same manner as in preparation of the sample 1 described above except that the thickness of the first barrier layer 1 was changed from 200 nm to 30 nm.

[Preparation of Sample 5]

A sample 5 was prepared in the same manner as in preparation of the sample 1 described above except that the thickness of the first barrier layer 1 was changed from 200 nm to 20 nm.

[Preparation of Sample 6]

A sample was prepared in the same manner as in preparation of the sample 1 described above except that the thickness of the first barrier layer 1 was changed from 200 nm to 10 nm.

[Preparation of Sample 7]

A sample 7 was prepared in the same manner as in preparation of the sample 1 described above except that the thickness of the first barrier layer 1 was changed from 200 nm to 5 nm.

[Preparation of Sample 8]

A sample 8 was prepared in the same manner as in preparation of the sample 7 described above except that the gas pressure during formation of the first barrier layer 1 was changed from 0.1 Pa to 0.5 Pa.

[Preparation of Sample 9]

A sample 9 was prepared in the same manner as in preparation of the sample 1 described above except that a gas obtained by vaporizing tetramethyldisiloxane (abbreviated as TMDSO in Table 1) as an organic silicon compound at 40° C. was used in place of the monosilane gas as an inorganic silicon compound used for formation of the first barrier layer 1.

[Preparation of Sample 10]

A sample 10 was prepared in the same manner as in preparation of the sample 3 described above except that the first barrier layer 2 ($SiO_2$ film) described below used in place of the first barrier layer 1.

(Formation of First Barrier Layer 2)

Using a vacuum plasma CVD apparatus shown in FIG. 3, a $SiO_2$ film was formed on a transparent resin base (polyethylene naphthalate (PEN) film with a clear hard coat layer (CHC) manufactured by KIMOTO CO., LTD. (thickness of PEN: 125 µm; thickness of CHC: 6 µm)) under the following film formation conditions. The high-frequency power source used at this time a high-frequency power source at 27.12 MHz, and the distance between electrodes was 20 mm. As source gases, an argon gas flow rate of 150 sccm, a monosilane gas at a flow rate of 7.5 sccm and a nitrous oxide gas at a flow rate of 130 scorn were introduced into a vacuum chamber. The temperature of a film substrate was set to 100° C. and the gas pressure during film formation was set to 200 Pa at the start of the film formation and a silicon oxide layer ($SiO_2$ layer) was formed in a thickness of 50 nm.

[Preparation of Sample 11]

A sample 11 was prepared in the same manner as in preparation of the sample 10 described above except that the first barrier layer 1 of the sample 2 (silicon oxynitride film; vapor deposition treatment using a vacuum plasma CVD apparatus) was used as a second barrier layer 2 in place of the second barrier layer 1 (silicon oxynitride film; modification treatment by vacuum ultraviolet light using an excimer irradiation apparatus)

[Preparation of Sample 12]

A sample 12 was prepared in the same manner as in preparation of the sample 3 described above except that as a modification treatment of the second barrier layer 1, a heating treatment was carried out at 160° C. for 1 hour in place of the modification treatment by vacuum ultraviolet light using an excimer irradiation apparatus.

The characteristics of the structures of the samples prepared as described above are shown in Table 1.

TABLE 1

| GAS BARRIER FILM NUMBER | FIRST BARRIER LAYER | | | | | SECOND BARRIER LAYER | | | |
|---|---|---|---|---|---|---|---|---|---|
| | FORMATION CONDITIONS | | | RAW | | | | | |
| | FORMATION METHOD | GAS PRESSURE (Pa) | COMPOSITION | MATERIAL FOR FORMATION | THICKNESS (nm) | FORMATION METHOD | MODIFICATION METHOD | COMPOSITION | THICKNESS (nm) |
| 1 | VACUUM PLASMA CVD METHOD | 0.1 | SiON | MONOSILANE | 200 | WET COATING METHOD | EXCIMER IRRADIATION APPARATUS | SiON | 100 |
| 2 | VACUUM PLASMA CVD METHOD | 0.1 | SiON | MONOSILANE | 100 | WET COATING METHOD | EXCIMER IRRADIATION APPARATUS | SiON | 100 |
| 3 | VACUUM PLASMA CVD METHOD | 0.1 | SiON | MONOSILANE | 50 | WET COATING METHOD | EXCIMER IRRADIATION APPARATUS | SiON | 100 |
| 4 | VACUUM PLASMA CVD METHOD | 0.1 | SiON | MONOSILANE | 30 | WET COATING METHOD | EXCIMER IRRADIATION APPARATUS | SiON | 100 |
| 5 | VACUUM PLASMA CVD METHOD | 0.1 | SiON | MONOSILANE | 20 | WET COATING METHOD | EXCIMER IRRADIATION APPARATUS | SiON | 100 |
| 6 | VACUUM PLASMA CVD METHOD | 0.1 | SiON | MONOSILANE | 10 | WET COATING METHOD | EXCIMER IRRADIATION APPARATUS | SiON | 100 |
| 7 | VACUUM PLASMA CVD METHOD | 0.1 | SiON | MONOSILANE | 5 | WET COATING METHOD | EXCIMER IRRADIATION APPARATUS | SiON | 100 |

TABLE 1-continued

| | FIRST BARRIER LAYER | | | | | SECOND BARRIER LAYER | | | |
|---|---|---|---|---|---|---|---|---|---|
| GAS BARRIER FILM NUMBER | FORMATION METHOD | GAS PRESSURE (Pa) | COMPOSITION | RAW MATERIAL FOR FORMATION | THICKNESS (nm) | FORMATION METHOD | MODIFICATION METHOD | COMPOSITION | THICKNESS (nm) |
| 8 | VACUUM PLASMA CVD METHOD | 0.5 | SiON | MONOSILANE | 5 | WET COATING METHOD | EXCIMER IRRADIATION APPARATUS | SiON | 100 |
| 9 | VACUUM PLASMA CVD METHOD | 0.1 | SiON | TMDSO | 50 | WET COATING METHOD | EXCIMER IRRADIATION APPARATUS | SiON | 100 |
| 10 | VACUUM PLASMA CVD METHOD | 0.2 | $SiO_2$ | MONOSILANE | 50 | WET COATING METHOD | EXCIMER IRRADIATION APPARATUS | SiON | 100 |
| 11 | VACUUM PLASMA CVD METHOD | 0.1 | $SiO_2$ | MONOSILANE | 50 | VACUUM PLASMA CVD METHOD | — | SiON | 100 |
| 12 | VACUUM PLASMA CVD METHOD | 0.1 | SiON | MONOSILANE | 50 | WET COATING METHOD | HEATING MODIFICATION METHOD | SiON | 100 |

<Evaluation of Performance of Gas Barrier Film>
[Evaluation of Gas Barrier Properties: Measurement of Water Vapor Transmission Rate 1]

Water vapor transmission rates $R_1$ and $R_2$ were measured according to the following method for a sample in which layers up to and including the first barrier layer were formed on the base prepared as described above and each gas barrier film.

(Apparatus)

Deposition apparatus: Vacuum deposition apparatus JEE-400 manufactured by JEOL Ltd., Constant temperature and humidity oven: Yamato Humidic Chamber IG47M Metal corroded by reaction with moisture: calcium (granular)

Metal impermeable to water vapor: aluminum. (ϕ 3 to 5 mm; granular)

(Preparation of Cell for Evaluation of Water Vapor Barrier Properties)

Metal calcium was deposited using a vacuum deposition apparatus (Vacuum deposition apparatus JEE-400 manufactured by JEOL Ltd.,) while a section other than sections intended for deposition (9 sections each having a size of 12 mm×12 mm) on the barrier film sample before deposition of a transparent conductive film were masked. Thereafter, the mask was removed in the vacuum state and aluminum was deposited on the entire surface of the other side of the sheet from a metal evaporation source. After aluminum was deposited, the vacuum state was released and the aluminum-deposited-side of the sample was faced to a quartz glass having a thickness of 0.2 mm with a ultraviolet curable resin for sealing (manufacture by Nagase ChemteX Corporation) between them and it was irradiated with an ultraviolet ray under an atmosphere of dry nitrogen gas, so that a cell for evaluation of water vapor barrier was prepared quickly. A cell for evaluation of the water vapor barrier was prepared in the same manner as described above for the sample in which layers up to and including the first barrier layer were formed on the base.

The obtained sample, the both surfaces of which were sealed, was stored under high-humidity conditions of 40° C. and 90% RH and the amount of moisture passing into the cell was calculated from the corrosion amount of metal calcium according to the method described in JP 2005-283561A. And then the water vapor transmission rate $R_1$ of the sample in which layers up to and including the first barrier layer were formed on the base, the water vapor transmission rate $R_2$ of each gas barrier film and the water vapor transmission rate ratio $R_1/R_2$ were calculated.

For confirming that water vapor passed only from the surface of the barrier film, a sample prepared by depositing metal calcium using a quartz glass having a thickness of 0.2 mm was stored under high-temperature and high-humidity conditions of 60° C. and 90% RH as a comparative sample in place of the gas barrier film sample, so that it was confirmed that corrosion of metal calcium did not occur even after elapse of 1000 hours.

Measurement results thus obtained are shown in Table 2.

[Evaluation of Durability: Measurement of Water Vapor Transmission Rate 2]

The water vapor transmission rate $R_3$ of each gas barrier film was measured in the same manner as in the measurement of the water vapor transmission rate 1 described above except that the measurement environment was changed from 40° C. and 90% RH to a high-temperature and high-humidity environment of 60° C. and 90% RH.

[Evaluation of Flexing Resistance: Measurement of Water Vapor Transmission Rate 3]

Each gas barrier film was bent, under an environment of 23° C. and 55% RH, at an angle of 180 degrees so as to produce a curvature with a radius of 10 mm in such a manner that the barrier layer of each gas barrier film was at the outer side, followed by releasing the barrier film. After this operation was repeated 100 times, the water vapor transmission rate (g/m$^2$/day) $R_4$ under conditions of 40° C. and 90% RH was measured in the same manner as in the measurement of the water vapor transmission rate $R_2$ described above, and this value was used as a measure of the bending resistance (evaluated by a degree of deterioration with respect to the water vapor transmission rate $R_2$ of the untreated film).

[Evaluation of Durability in Electronic Device]

(Preparation of Organic Photoelectric Conversion Element)

An article obtained by depositing an indium tin oxide (ITO) transparent conductive film in a thickness of 150 nm on each of the gas barrier films 1 to 12 prepared in Example 1 (sheet resistance 10Ω/□) was patterned in a width of 2 mm using a general photolithography technique and wet etching, so that a first electrode was formed. The first electrode, which was pattern-formed, was cleaned by ultrasonic cleaning with a surfactant and ultrapure water and ultrasonic cleaning with ultrapure water in this order, thereafter dried by a nitrogen blow and finally subjected to ultraviolet ozone cleaning.

On this transparent substrate, Baytron P4083 (manufactured by Starkvitek) as a conductive polymer was applied and dried so as to have a (average) thickness of 30 nm and thereafter heat-treated at 150° C. for 30 minutes to form a positive hole transport layer.

After these steps, the substrate was brought in a nitrogen chamber and operations were carried out under a nitrogen atmosphere.

First, the substrate was heated at 150° C. for 10 minutes under a nitrogen atmosphere. Next, P3HT (manufactured by Prectronics Corporation; regioregular poly(3-hexylthiophene)) and PCBM (manufactured by Frontier Carbon Corporation; 6,6-phenyl-C61-butylic acid methyl ester) were mixed in chlorobenzene at a ratio of 1:0.8 so that the concentration was 3.0% by mass, the liquid thus prepared was applied so as have a (average) thickness of 100 nm while being filtered by a filter, and left standing at room temperature to be cried. Subsequently, the coated film was heated at 150° C. for 15 minutes to form a photoelectric conversion layer.

Next, the substrate on which the above described series of functional layers were formed was transferred into a vacuum deposition apparatus chamber, the pressure in the vacuum deposition apparatus was reduced to 1×10$^{-4}$ Pa or less, lithium fluoride was thereafter deposited in a thickness of 0.6 nm at a deposition rate of 0.01 nm/second, and subsequently Al metal was deposited in a thickness of 100 nm at a deposition rate of 0.2 nm/second through a shadow mask having a width of 2 mm (deposited with the shadow mask orthogonally crossing so that the light-receiving section had a size of 2×2 mm), so that a second electrode was formed. The obtained organic photoelectric conversion element was transferred into a nitrogen chamber and sealed with a sealing cap and an LTV-curable resin to prepare organic photoelectric conversion elements 1 to 12 with the light-receiving section having a size of 2 mm.

(Sealing of Organic Photoelectric Conversion Element)

An epoxy-based photocurable adhesive was applied as a seal material to the surface provided with a gas barrier layer using two sheets of gas barrier films 1 to 12 under an environment purged with a nitrogen gas (inert, gas). An organic photoelectric conversion element corresponding to each of gas barrier films 1 to 8 obtained by the method described above was inserted between the adhesive-coated surfaces of two sheets of gas barrier films 1 to 12 coated with the adhesive and closely contacted with the surfaces, and cured by applying UV light from the substrate side on one side to form each of organic photoelectric conversion elements 1 to 12.

(Electronic Device Evaluation)

Electronic device evaluations (durability) in the environment of temperature of 4.0° C. and humidity of 90% RH and the environment of temperature of 60° C. and humidity of 90% RH were performed according to the following method for the above-prepared organic photoelectric conversion element.

Light having an intensity of 100 mW/cm$^2$ from a solar simulator (AM 1.5 G filter) was applied on the light receiving sections with a mask having an effective area of 4.0 mm$^2$ superimposed thereon and IV characteristics were evaluated, so that the short circuit current density Jsc (mA/cm$^2$), the open voltage Voc (V) and the fill factor FF (%) of the light receiving sections formed at 4 locations on the element were each measured, and a 4-point average of energy conversion efficiency PCE (%) determined in accordance with the following formula 1 was estimated.

Formula 1

$$PCE\ (\%)=[Jsc\ (mA/cm^2) \times Voc\ (V) \times FF\ (\%)]/100\ mW/\text{Initial}$$

Initial energy conversion efficiency as an initial battery characteristic was measured, energy conversion efficiency after an accelerated test of storing the device in the environment of temperature of 40° C. and humidity of 90% RH and the environment of temperature of 60° C. and humidity of 90% RH for 1000 hours, respectively, was then measured for the degree of deterioration of performance with time, the conversion efficiency survival rate was determined in accordance with the following formula and electronic device evaluation (durability) was performed in accordance with the following criteria.

Conversion efficiency residual rate=conversion efficiency after acceleration test/initial conversion efficiency×100(%)

5: conversion efficiency residual rate is 90% or more.

4: conversion efficiency residual rate is 70% or more and 90% or less.

3: conversion efficiency residual rate is 40% or more and 70% or less.

2: conversion efficiency residual rate is 20% or more and 40% or less

1: conversion efficiency residual rate is less than 20%

Results thus obtained are shown in Table 2.

TABLE 2

| GAS BARRIER FILM NUMBER | WATER VAPOR TRANSMISSION RATE 1 (40° C., 90% RH) | | | WATER VAPOR TRANSMISSION RATE 2 (60° C., 90% RH) | FLEXING RESISTANCE (40° C., 90% RH) | ELECTRONIC DEVICE EVALUATION WATER VAPOR TRANSMISSION RATE | | REMARKS |
|---|---|---|---|---|---|---|---|---|
| | $R_1$ (*1) | $R_2$ (*2) | $R_1/R_2$ | $R_3$ | $R_3$(*3) | *4 | *5 | |
| 1 | $1.0 \times 10^{-3}$ | $7.0 \times 10^{-5}$ | 14 | $2.0 \times 10^{-3}$ | $9.0 \times 10^{-5}$ | 5 | 2 | COMPARATIVE EXAMPLE |
| 2 | $3.0 \times 10^{-3}$ | $5.5 \times 10^{-5}$ | 55 | $7.0 \times 10^{-4}$ | $7.0 \times 10^{-5}$ | 5 | 3 | COMPARATIVE EXAMPLE |
| 3 | $5.0 \times 10^{-3}$ | $4.5 \times 10^{-5}$ | 111 | $5.5 \times 10^{-5}$ | $4.5 \times 10^{-5}$ | 5 | 5 | INVENTION |
| 4 | $1.5 \times 10^{-2}$ | $5.0 \times 10^{-5}$ | 300 | $5.0 \times 10^{-5}$ | $5.0 \times 10^{-5}$ | 5 | 5 | INVENTION |
| 5 | $5.0 \times 10^{-2}$ | $5.0 \times 10^{-5}$ | 1000 | $5.0 \times 10^{-5}$ | $5.0 \times 10^{-5}$ | 5 | 5 | INVENTION |
| 6 | 0.15 | $5.5 \times 10^{-5}$ | 2727 | $5.5 \times 10^{-5}$ | $6.0 \times 10^{-5}$ | 5 | 5 | INVENTION |
| 7 | 0.40 | $6.5 \times 10^{-5}$ | 6154 | $6.0 \times 10^{-4}$ | $8.0 \times 10^{-5}$ | 5 | 3 | COMPARATIVE EXAMPLE |
| 8 | 0.60 | $6.0 \times 10^{-5}$ | 10000 | $9.0 \times 10^{-4}$ | $1.0 \times 10^{-4}$ | 5 | 2 | COMPARATIVE EXAMPLE |
| 9 | $1.0 \times 10^{-2}$ | $9.0 \times 10^{-4}$ | 11 | $9.0 \times 10^{-3}$ | $1.0 \times 10^{-3}$ | 3 | 1 | COMPARATIVE EXAMPLE |
| 10 | $7.0 \times 10^{-3}$ | $8.0 \times 10^{-5}$ | 88 | $8.0 \times 10^{-5}$ | $8.5 \times 10^{-5}$ | 5 | 4 | INVENTION |
| 11 | $5.0 \times 10^{-3}$ | $2.0 \times 10^{-3}$ | 3 | $3.0 \times 10^{-3}$ | $3.0 \times 10^{-3}$ | 3 | 2 | COMPARATIVE EXAMPLE |
| 12 | $5.0 \times 10^{-3}$ | $3.0 \times 10^{-3}$ | 2 | $6.0 \times 10^{-2}$ | $2.0 \times 10^{-2}$ | 3 | 1 | COMPARATIVE EXAMPLE |

*1 WATER VAPOR TRANSMISSION RATE (g/m²/day) IN BASE/FIRST BARRIER LAYER
*2 WATER VAPOR TRANSMISSION RATE (g/m²/day) IN BASE/FIRST BARRIER LAYER/SECOND BARRIER LAYER
*3 WATER VAPOR TRANSMISSION RATE AFTER REPEATING FLEXING 100 TIMES AT AN ANGLE OF 180 DEGREES SO AS TO PRODUCE A CURVATURE RADIUS OF 10 mm
*4 40° C., 90% RH
*5 60° C., 90% RH As is clear from the results described in Table 2, it is apparent that the gas barrier film according to the embodiment of the invention has excellent barrier properties because the water vapor transmission rate, $R_2$ in an environment of 40° C. and 90% RH is low and it is excellent in durability because the degree of deterioration of the water vapor transmission rate $R_3$ under a high-temperature and high-humidity environment (60° C. and 90% RH) with respect to the water vapor transmission rate $R_2$ is small. It is apparent that the gas barrier film is also excellent in bending resistance because the degree of deterioration of the water vapor transmission rate $R_4$ after the bending treatment with respect to the water vapor transmission rate $R_2$ is small.

Further, it is apparent the organic photoelectric conversion element according to the embodiment of the invention, which is prepared using the gas barrier film according to the embodiment of the invention, is resistant to be degraded in terms of barrier performance even under a high-temperature and high-humidity environment in comparison with Comparative Example

INDUSTRIAL APPLICABILITY

The present invention can be used for packages of electronic devices and the like, solar cells and organic EL elements, display materials such as plastic substrates for liquid crystal displays and the like, and so on.

REFERENCE SIGNS LIST

11 Gas barrier film
12 Base (Substrate)
13 First barrier layer
14 Second barrier layer
15 Primary layer
16 Intermediate layer
17 Protective layer
L Modification treatment means
21 Plasma CVD apparatus
22 Vacuum chamber
23 Cathode electrode
24 Susceptor
25 Heat medium circulation system
26 Vacuum evacuation system
27 Gas introduction system
28 High-frequency power source
29 Base
30 heating-cooling unit

The invention claimed is:

1. A gas barrier film comprising:
   a base;
   a first barrier layer containing silicon which is formed on at least one surface of the base; and
   a second barrier layer consisting of one layer containing silicon oxynitride which is formed on the first barrier layer,
   wherein a ratio ($R_1/R_2$) of a water vapor transmission rate $R_1$ to a water vapor transmission rate $R_2$ is 80 or more and 5000 or less, wherein the water vapor transmission rate $R_1$ (g/m²/day) at 40° C. and 90% RH is 1.0 (g/m²/day)≥$R_1$≥$1.0\times10^{-3}$ (g/m²/day) and is calculated based on a structure in which one barrier layer containing the first barrier layer is formed on the base, and the water vapor transmission rate $R_2$ (g/m²/day) at 40° C. and 90% RH is $1.0\times10^{-3}$ (g/m²/day)>$R_2$≥$1.0=10^{-5}$ (g/m²/day) and is calculated based on a structure in which two barrier layers containing the first barrier layer and the second barrier layer are laminated on the base.

2. The gas barrier film according to claim 1, wherein the first barrier layer is a silicon nitride film or a silicon oxynitride film formed by using, as a raw material, monosilane ($SiH_4$) as the inorganic silicon compound and at least one gas selected from the group consisting of an ammonia gas, hydrogen gas, nitrogen gas, and nitrogen oxide gas.

3. The gas barrier film according to claim 1, wherein both of the first barrier layer and the second barrier layer are silicon oxynitride (SiON) films.

4. An electronic device sealed with the gas barrier film according to claim 1.

5. A solar cell sealed by the gas barrier film according to claim 1.

6. An illuminator comprising an organic electroluminescence material sealed by the gas barrier film according to claim 1.

7. A display apparatus comprising an organic electroluminescence material sealed by the gas barrier film according to claim 1.

8. An organic photoelectric conversion element sealed by the gas barrier film according to claim 1.

9. An organic electroluminescence element sealed by the gas barrier film according to claim 1.

10. A method of producing a gas barrier film in which a base; a first barrier layer containing silicon which is formed on at least one surface of the base by a plasma chemical vapor deposition method using at least an inorganic silicon compound as a raw material; and a second barrier layer consisting of one layer containing silicon oxynitride, which is formed on the first barrier layer by applying an inorganic compound-containing liquid and subsequently being subjected to a modification treatment, are laminated in this order, wherein a ratio ($R_1/R_2$) of a water vapor transmission rate $R_1$ to a water vapor transmission rate $R_2$ is 80 or more and 5000 or less, wherein the water vapor transmission rate $R_1$ (g/m$^2$/day) at 40° C. and 90% RH is 1.0 (g/m$^2$/day)≥$R_1$≥1.0×10$^{-3}$ (g/m$^2$/day) and is calculated based on a structure in which one barrier layer containing the first barrier layer is formed on the base, and the water vapor transmission rate $R_2$ (g/m$^2$/day) at 40° C. and 90% RH is 1.0×10$^{-3}$ (g/m$^2$/day)>$R_2$≥1.0×10$^{-5}$ (g/m$^2$/day) and is calculated based on a structure in which two barrier layers containing the first barrier layer and the second barrier layer are laminated on the base.

11. The method of producing a gas barrier film according to claim 10, wherein the first barrier layer is a silicon nitride film or a silicon oxynitride film formed by using, as a raw material, monosilane (SiH$_4$) as the inorganic silicon compound and at least one gas selected from the group consisting of an ammonia gas, hydrogen gas, nitrogen gas, and nitrogen oxide gas.

12. The method of producing a gas barrier film according to claim 10, wherein both of the first barrier layer and the second barrier layer are silicon oxynitride (SiON) films.

* * * * *